(12) United States Patent
Kamiya

(10) Patent No.: US 11,165,438 B2
(45) Date of Patent: Nov. 2, 2021

(54) ERROR-CORRECTION ENCODING METHOD AND DEVICE, AND DECODING METHOD AND DEVICE USING CHANNEL POLARIZATION

(71) Applicant: NEC Corporation, Tokyo (JP)

(72) Inventor: Norifumi Kamiya, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/956,004

(22) PCT Filed: Dec. 27, 2017

(86) PCT No.: PCT/JP2017/046930
§ 371 (c)(1),
(2) Date: Jun. 19, 2020

(87) PCT Pub. No.: WO2019/130475
PCT Pub. Date: Jul. 4, 2019

(65) Prior Publication Data
US 2020/0321982 A1    Oct. 8, 2020

(51) Int. Cl.
*H03M 13/11* (2006.01)
*H03M 13/09* (2006.01)
(Continued)

(52) U.S. Cl.
CPC ....... *H03M 13/1168* (2013.01); *H03M 13/09* (2013.01); *H03M 13/1105* (2013.01);
(Continued)

(58) Field of Classification Search
CPC .................................................. H03M 13/1168
(Continued)

(56) References Cited

U.S. PATENT DOCUMENTS 5,493,407 A * 2/1996 Takahara ................ G06T 9/005
341/63
7,016,337 B1 * 3/2006 Wu ...................... H04L 12/6418
370/352
(Continued)

FOREIGN PATENT DOCUMENTS

EP        2953307 A1      12/2015
JP     2016-515329 A       5/2016
(Continued)

OTHER PUBLICATIONS

International Search Report corresponding to PCT/JP2017/046930, 1 page, dated Mar. 13, 2018.
(Continued)

*Primary Examiner* — Fritz Alphonse

(57) ABSTRACT

[Problem] Encoding and decoding techniques capable of speeding up an error-correction decoding process utilizing channel polarization are provided.
[Solution] In an encoding device, the information bit sequence is input on division for each designated bit length; error-correction encoding is performed on an information block of the designated bit length to generate L M-bit codes, each M-bit code having a predetermined bit length M; the L M-bit codes are converted into M L-bit blocks each having a predetermined bit length of L; the M L-bit blocks are Polar-converted to M L-bit codes, each L-bit code having a bit length of L, through channel polarization processing; and division of the information bit sequence is determined based on channel polarization information.

16 Claims, 18 Drawing Sheets

(51) Int. Cl.
*H03M 13/13* (2006.01)
*H03M 13/25* (2006.01)
*H03M 13/29* (2006.01)
*H03M 13/41* (2006.01)

(52) U.S. Cl.
CPC ......... *H03M 13/13* (2013.01); *H03M 13/256* (2013.01); *H03M 13/2906* (2013.01); *H03M 13/41* (2013.01)

(58) Field of Classification Search
USPC .................................. 714/752, 751, 758, 763
See application file for complete search history.

(56) References Cited

U.S. PATENT DOCUMENTS

| | | | |
|---|---|---|---|
| 7,593,433 B1* | 9/2009 | Wu ..................... | H04J 14/0227 370/537 |
| 10,069,519 B1* | 9/2018 | Millar ................... | H04L 1/0042 |
| 2009/0238479 A1* | 9/2009 | Jaggi .................... | H04N 19/172 382/236 |
| 2015/0381208 A1 | 12/2015 | Li et al. | |
| 2020/0106459 A1* | 4/2020 | Gross ................ | H03M 13/2906 |

FOREIGN PATENT DOCUMENTS

| | | |
|---|---|---|
| JP | 2017-512004 A | 4/2017 |
| WO | WO-2007/132656 A1 | 11/2007 |
| WO | WO-2010/073922 A1 | 7/2010 |

OTHER PUBLICATIONS

Arikan, E., Channel polarization: A method for constructing capacity-achieving codes for symmetric binary-input memoryless channels, IEEE Transactions on Information Theory, vol. 55, No. 7, 23 pages, Jul. 2009.

Tai, I. and Vardy, A., List Decoding of Polar Codes, IEEE Transactions on Information Theory, vol. 61, No. 5, pp. 2213-2226, May 2015.

Yazdi, A. and Kschischang, F., A Simplified Successive-Cancellation Decoder for Polar Codes, IEEE Communications Letters, vol. 15, No. 12, pp. 1378-1380, Dec. 2011.

Huawei, et al., Details of the Polar code design, 3GPP TSG RAN WGI Meeting #87 R1-1611254, 16 pages, Nov. 14, 2016.

Ericsson, Consideration of Implementation Aspects of Polar Codes, 3GPP TSG RAN WG1 Meeting #87, R1-1611318, 7 pages, Nov. 18, 2016.

* cited by examiner

ERROR-CORRECTION ENCODING METHOD AND DEVICE, AND DECODING METHOD AND DEVICE USING CHANNEL POLARIZATION

CROSS-REFERENCE TO RELATED APPLICATIONS

This application is a national stage application of International Application No. PCT/JP2017/046930 entitled "ERROR-CORRECTION ENCODING METHOD AND DEVICE, AND DECODING METHOD AND DEVICE USING CHANNEL POLARIZATION," filed on Dec. 27, 2017, the disclosures of which is hereby incorporated by reference in their entirety.

The present invention relates to encoding/decoding techniques capable of correcting bit errors occurring in digital data, and more particularly to an encoding/decoding technique using channel polarization.

BACKGROUND ART

In operations of digital data communication systems and memory systems, it is necessary to take measures against bit errors that may occur due to various factors. Error-correction encoding, which is a typical technique thereof, makes it possible to correct bit errors by calculating redundant data from a data sequence through predetermined calculation and adding it to the data sequence. For example, Patent Literatures 1 and 2 disclose an error-correction encoding technique which improves the encoding gain by dividing an information bit sequence using the property of a low-density parity check code. The bit-error tolerance of the error-correction encoding system depends on redundancy and the statistical property of a transmission channel.

A Polar encoding technique using channel polarization has been known as a system having the highest bit-error tolerance (Non-Patent Literature 1). Channel polarization is to polarize multiple channels into highly reliable channels with high error tolerance and channels with low error tolerance by linear conversion of channels. Using channels with high error tolerance enables highly reliable information communication. The Polar encoding technique can guarantee the error tolerance reaching the theoretical limit by setting the frame length extremely long. Further, in the case of a frame length of about several thousands of bits, by applying the SC-List decoding method (Non-Patent Literature 2) to the Polar encoding technique, it is possible to achieve a higher error-correction capability than other encoding techniques. Further, Patent Literature 3 discloses a rate matching technique for Polar codes and provides a means for generating Polar codes having different frame lengths from a single Polar code in accordance with the system requirements.

Further, as a technique for suppressing the decoding latency in the Polar encoding technique, a Simplified SC (SSC) decoding method has been proposed by which the SC decoding method can be simplified by selecting calculations that can be removed (Non-Patent Literature 3).

PRIOR ART LITERATURE

Patent Literature

[Patent Literature 1]
WO2010/073922 Pamphlet
[Patent Literature 2]
Wo2007/132656 Pamphlet
[Patent Literature 3]
JP 2017-512004

Non-Patent Literature

[Non-Patent Literature 1]
E. Arikan, "Channel polarization: A method for constructing capacity-achieving codes for symmetric binary-input memoryless channels," IEEE Transactions on Information Theory, vol. 55, no. 7, pp. 3051-3073, July 2009.
[Non-Patent Literature 2]
I. Tal and A. Vardy, "List decoding of polar codes," IEEE Transactions on Information Theory, vpl. 61, no. 5, pp. 2213-2226, May 2015.
[Non-Patent Literature 3]
A. A. A. D. Yazdi and F. R. Kschischang, "A simplified successive-cancellation decoder for polar codes", IEEE Communications Letters, vol. 15, no. 2, pp. 1378-1380, December 2011.

DISCLOSURE OF INVENTION

Problems to be Solved by Invention

A problem in the Polar encoding technique is the difficulty in enhancing the speed of the decoding process.

For instance, according to the Successive-Cancellation decoding method (hereinafter abbreviated as SC decoding method) presented in Non-Patent Literature 1, error-correction processing is sequentially performed on a bit-by-bit basis from the beginning, resulting in theoretical difficulty in increasing the speed through parallel processing. Accordingly, the Polar encoding technique has an advantage that the longer the frame length, the higher the bit error tolerance, but has a disadvantage that the longer the frame length, the longer processing latency due to difficulty in parallelization of decoding processing.

Further, in the SC-List decoding method which is particularly effective in the case of frame lengths of about several thousand bits or less, an increase in processing delay due to difficulty in parallel processing becomes more and more significant.

Further, in the above-mentioned SSC decoding method, the selection of processing calculations that can be removed in the SC decoding method depends on the configuration method of the Polar code and the setting parameters such as coding rate. Accordingly, it is difficult to apply the SSC decoding method to a system that requires a wide range of parameter settings according to changes in communication conditions. Recently, due to growing in transmission capacity, a system that adaptively changes the coding rate and the number of values in multilevel modulation according to the communication channel situation has become the mainstream, so that it becomes more and more difficult to apply the SSC decoding method.

Therefore, the present invention is intended to solve the above problems, and an object thereof is to provide encoding and decoding techniques capable of speeding up an error-correction decoding process utilizing channel polarization.

Solution

According to a first aspect of the present invention, an encoding device that encodes an information bit sequence blocked into blocks of a constant bit length K to generate a code bit sequence of a constant bit length M×L, includes: an error-correction encoding means that inputs the information bit sequence on division for each designated bit length according to an information-bit length switching signal and performs error-correction encoding on an information block of the designated bit length to generate L M-bit codes, each M-bit code having a predetermined bit length M; a block length conversion means that converts the L M-bit codes into M L-bit blocks each having a predetermined bit length of L by reordering bits of the L M-bit codes; a Polar conversion means that converts the M L-bit blocks to M L-bit codes, each L-bit code having a bit length of L, through channel polarization processing to output a converted M×L-bit code as the code bit sequence; and an information bit length switching means that generates the information bit length switching signal for dividing the information bit sequence into L designated bit lengths which are not necessarily constant, based on channel polarization information of the Polar conversion means.

According to a second aspect of the present invention, a decoding device that inputs an input signal sequence and estimates an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, includes: M Polar decoding means that divides the input signal sequence into M input signal blocks, each input signal block including L input signals, performs the channel polarization processing on each of the M input signal blocks, and outputs L Polar decoded signals for each of the M input signal blocks; an error-correction decoding means that inputs a Polar decoded signal according to a designated bit length designated by an information bit length switching signal, from M Polar decoded signal blocks, each Polar decoded signal block including L Polar decoded signals which are output respectively by the M Polar decoding means, and estimates the information bit sequence according to error-correction decoding scheme; and an information bit length switching means that generates the information bit length switching signal for designating, as the designated bit length, an information bit length included in the M Polar decoded signal blocks output respectively by the M Polar decoding means.

According to a third aspect of the present invention, an encoding method for encoding an information bit sequence blocked into blocks of a constant bit length K to generate a code bit sequence of a constant bit length M×L, includes: by an error-correction encoding means, inputting the information bit sequence on division for each designated bit length according to an information-bit length switching signal and performing error-correction encoding on an information block of the designated bit length to generate L M-bit codes, each M-bit code having a predetermined bit length M; by a block length conversion means, converting the L M-bit codes into M L-bit blocks each having a predetermined bit length of L by reordering bits of the L M-bit codes; by a Polar conversion means, converting the M L-bit blocks to M L-bit codes, each L-bit code having a bit length of L, through channel polarization processing to output a converted M×L-bit code as the code bit sequence; and by an information bit length switching means, generating the information bit length switching signal for dividing the information bit sequence into L designated bit lengths which are not necessarily constant, based on channel polarization information of the Polar conversion means.

According to a fourth aspect of the present invention, a decoding method for inputting an input signal sequence and estimating an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, includes: by M Polar decoding means, dividing the input signal sequence into M input signal blocks, each input signal block including L input signals, performing the channel polarization processing on each of the M input signal blocks, and outputting L Polar decoded signals for each of the M input signal blocks; by an error-correction decoding means, inputting a Polar decoded signal according to a designated bit length designated by an information bit length switching signal, from M Polar decoded signal blocks, each Polar decoded signal block including L Polar decoded signals which are output respectively by the M Polar decoding means, and estimating the information bit sequence according to error-correction decoding scheme; and by an information bit length switching means, generating the information bit length switching signal for designating, as the designated bit length, an information bit length included in the M Polar decoded signal blocks output respectively by the M Polar decoding means.

According to a fifth aspect of the present invention, a program that causes a computer to function as an encoding device that encodes an information bit sequence blocked into blocks of a constant bit length K to generate a code bit sequence of a constant bit length M×L, includes: an error-correction encoding function of inputting the information bit sequence on division for each designated bit length according to an information-bit length switching signal and performs error-correction encoding on an information block of the designated bit length to generate L M-bit codes, each M-bit code having a predetermined bit length M; a block length conversion function of converting the L M-bit codes into M L-bit blocks each having a predetermined bit length of L by reordering bits of the L M-bit codes; a Polar conversion function of converting the M L-bit blocks to M L-bit codes, each L-bit code having a bit length of L, through channel polarization processing to output a converted M×L-bit code as the code bit sequence; and an information bit length switching function of generating the information bit length switching signal for dividing the information bit sequence into L designated bit lengths which are not necessarily constant, based on channel polarization information of the Polar conversion means.

According to a sixth aspect of the present invention, a program that causes a computer to function as an decoding device that inputs an input signal sequence and estimates an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, includes: M Polar decoding functions of dividing the input signal sequence into M input signal blocks, each input signal block including L input signals, of performing the channel polarization processing on each of the M input signal blocks, and of outputting L Polar decoded signals for each of the M input signal blocks; an error-correction decoding function of inputting a Polar decoded signal according to a designated bit length designated by an information bit length switching signal, from M Polar decoded signal blocks, each Polar decoded signal block including L Polar decoded signals which are output respectively by the M Polar decoding means, and estimating the information bit sequence according to error-correction decoding scheme; and an information bit length switching function of generating the information bit length switching signal for designating, as the designated bit length, an information bit length included in the M Polar decoded signal blocks output respectively by the M Polar decoding means.

Advantages of Invention

According to the present invention, high error-correction capability utilizing channel polarization is guaranteed, and high-speed processing is possible. Furthermore, switching error-correction encoders according to a designated bit length enables high-speed processing even in the case of setting a wide range of coding rates.

BRIEF DESCRIPTIONS OF DRAWINGS

EMBODIMENTS OF INVENTION

Summary of Exemplary Embodiments

According to an exemplary embodiment of the present invention, information regarding channel polarization, for example, frozen bit position information in the Polar encoding method is used to specify a bit length of the information to be encoded. The information bit sequence to be encoded is divided according to each of designated bit lengths. By performing error-correction encoding based on the information bit blocks thus divided and then performing Polar coding, it is possible to parallelize the Polar decoding at the decoding side. Furthermore, by switching error-correction encoders according to the designated bit length of the information bits to be encoded, it becomes applicable to a system that requires a wide range of parameter settings according to changes in the communication status.

Figure 1:
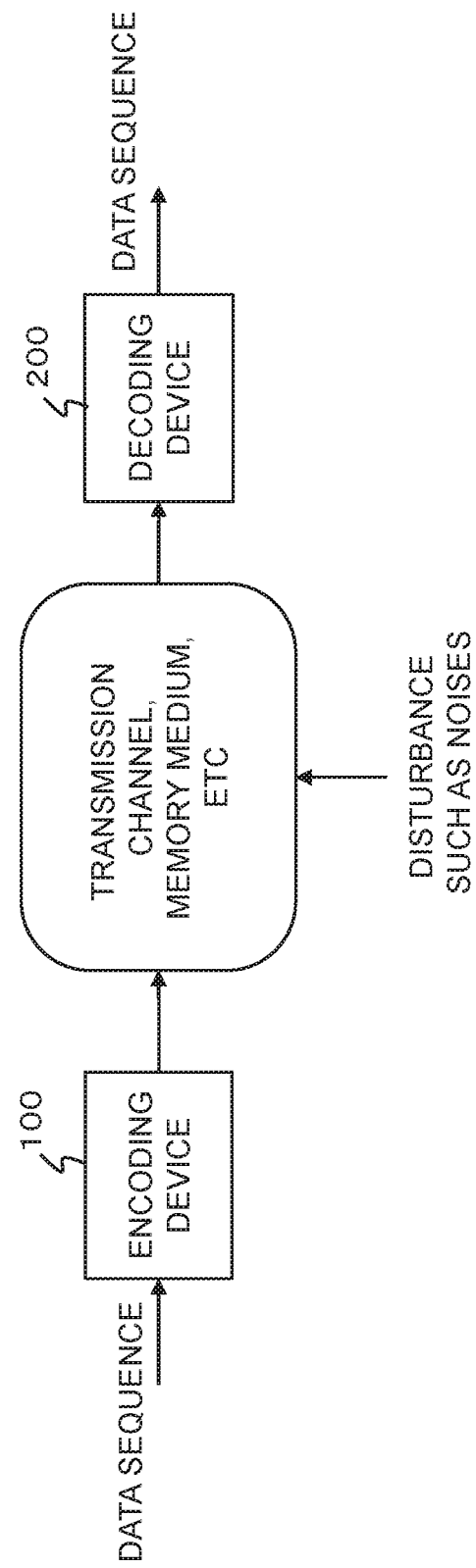
FIG. 1 is a diagram showing an example of a system configuration to which an encoding and decoding method according to the present invention is applied.

As illustrated in FIG. 1, an encoding device 100 and a decoding device 200 according to an exemplary embodiment of the present invention can be applied to communication systems via transmission channels or memory systems via memory media. The coding apparatus 100 encodes a data sequence to generate a code sequence, and a signal corresponding to the code sequence is transmitted through a transmission channel or stored in a memory or the like. The decoding device 200 estimates the original data sequence from the signal sequence received through the transmission channel or the signal sequence read from the memory.

In such a system, a bit error may occur in digital data due to disturbance such as noise during data transmission or data storage. The encoding/decoding method according to the present exemplary embodiment can correct such a bit error with high reliability and at high speed. Hereinafter, the exemplary embodiments of the present invention will be described in detail with reference to the drawings. However, the configurations described in the following embodiments are described as examples, and the technical scope of the present invention is not limited thereto.

1. Configuration 1.1) System

Figure 2:
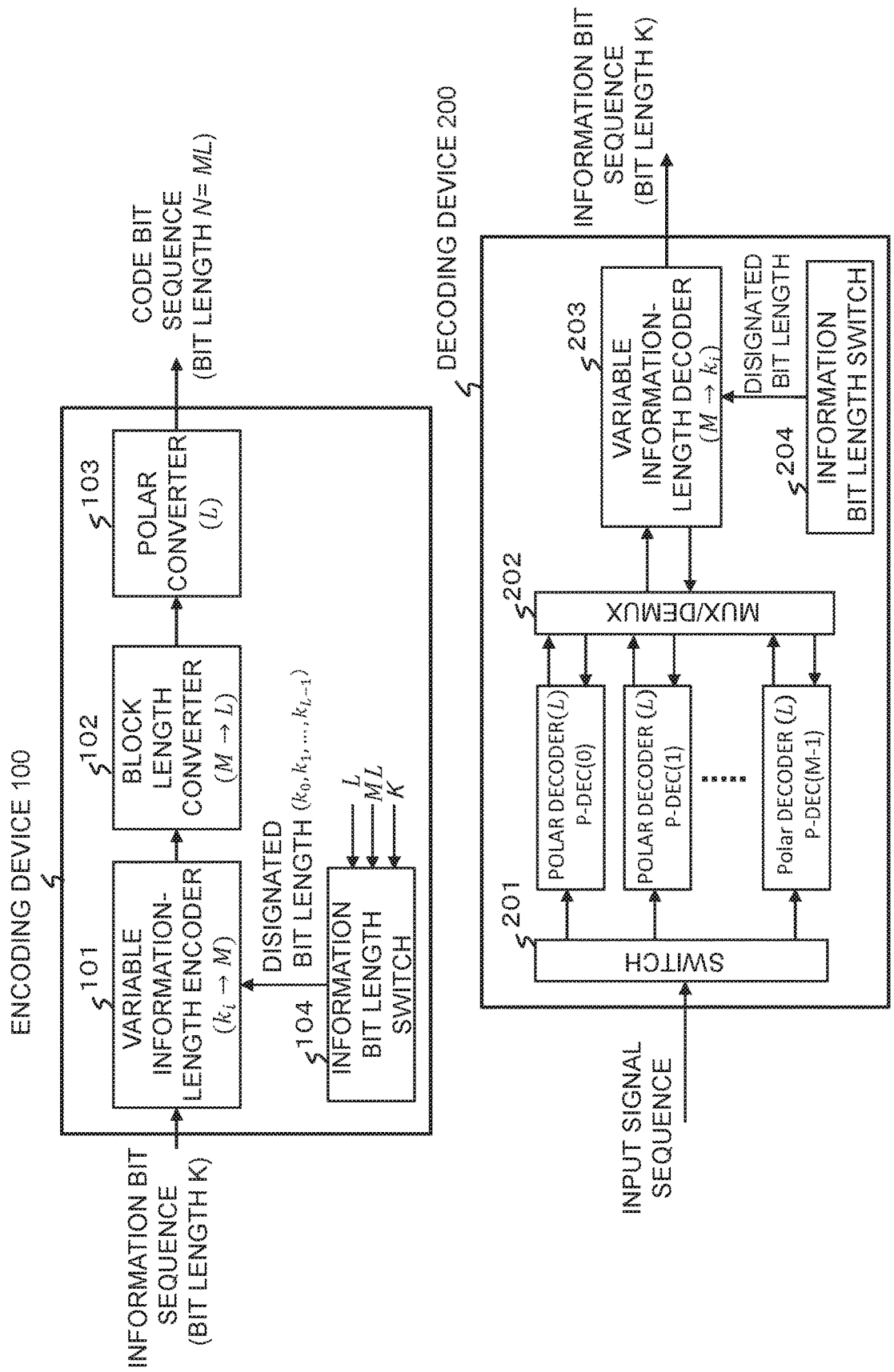
FIG. 2 is a block diagram showing a schematic configuration of an encoding device and a decoding device according to an embodiment of the present invention.

It is assumed that an encoding device 100 and a decoding device 200 illustrated in FIG. 2 constitute the encoding/decoding system as shown in FIG. 1.

The encoding apparatus 100 includes a variable information-length encoder 101, a block length converter 102, a Polar converter 103, and an information bit length switch 104. The variable information-length encoder 101 sequentially divides an information bit sequence of bit length K according to L designated bit lengths ($k_0, k_1, \ldots, k_{L-1}$) provided from the information bit length switch 104 and then adds redundant bits to the divided information bit block ki (i=0, 1, . . . , L−1) to generate a code of a constant bit length M. Accordingly, L is the number of divisions of the information bit sequence, and the L designated bit lengths $k_0, k_1, \ldots, k_{L-1}$ are not necessarily the same length. Each value of $k_0, k_1, \ldots, k_{L-1}$ can be determined depending on the channel polarization, specifically, depending on the frozen bit position information of the Polar encoding, as described later. The numerical value L is set to a power of 2. The block length converter 102, when inputting an M-bit code, converts the block length from M to L (details will be described later), and outputs a bit sequence of bit length L to the Polar converter 103. The Polar converter 103 performs the linear conversion on a bit sequence of the bit length L and outputs a code bit sequence of a bit length N=M×L.

The decoding device 200 includes: M Polar decoders P-DEC(j) (j=0, 1, 2, . . . , M−1) arranged in parallel between the switch 201 and the multiplexer/demultiplexer 202; a variable information-length decoder 203 connected to the multiplexer/demultiplexer 202; and an information bit length switch 204 which provides a designated bit length ($k_0, k_1, \ldots, k_{L-1}$) to the variable information-length decoder 203. The switch 201 inputs a signal sequence corresponding to the code bit sequence of the bit length M×L output from the encoding device 100, divides the signal sequence in signal sequence blocks corresponding to L-bit blocks of the code bit sequence, and sequentially outputs the signal sequence blocks to M Polar decoders P-DEC(j). The multiplexer/demultiplexer 202 receives signal sequences decoded respectively by the M Polar decoders P-DEC(j), and combines signals of the signal sequences in the same order starting the top of each signal sequence to output the combined signals to the variable information-length decoder 203. The variable information-length decoder 203 receives the signals of the signal sequences from the M Polar decoders P-DEC (j), and feeds code bits corresponding to the M signals respectively back to corresponding ones of the M Polar decoders P-DEC(j). Each Polar decoder P-DEC (j), while receiving a feedback code bit, performs decoding of the next input signal. Further, the variable information-length decoder 203 decodes the M-bit code by referring to the corresponding designated bit length to generate information bit blocks $k_i$, and sequentially selects them to decode the information bit sequence of the bit length K as decoded output. The functions of the information bit length switch 104 of the encoding device 100 and the information bit length switch 204 of the decoding device 200 will be described later.

Hereinafter, the functional blocks that respectively configure the encoding device 100 and the decoding device 200 will be further described.

1.2) Variable Information-Length Encoder

Figure 3:
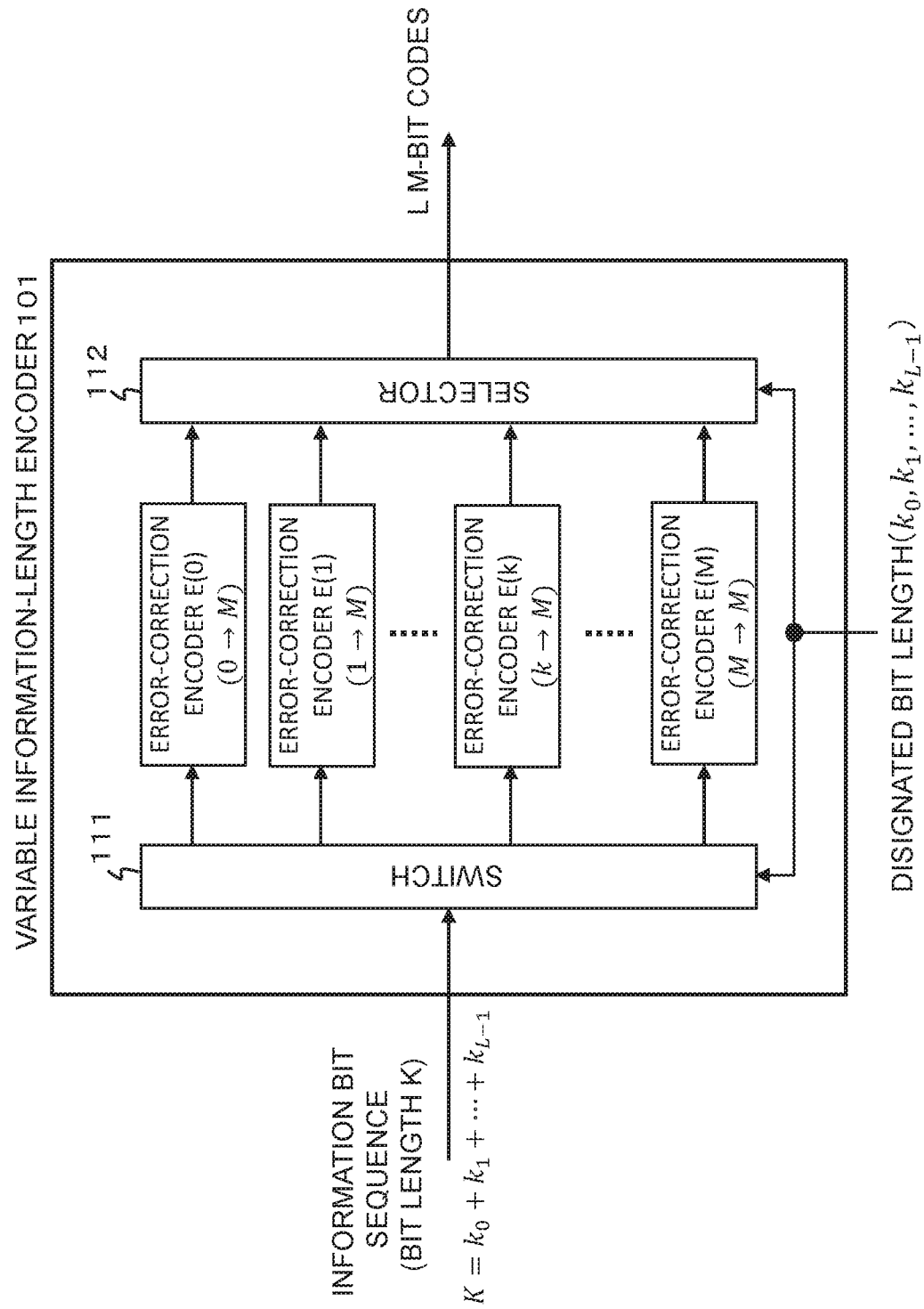
FIG. 3 is a block diagram showing a configuration example of a variable information-length encoder in the encoding device shown in FIG. 2.

As illustrated in FIG. 3, the variable information-length encoder 101 includes M+1 error-correction encoders E(h) (h=0, 1, 2, . . . , M) arranged in parallel between the switch 111 and the selector 112. The M+1 error-correction encoders E(h) are encoders corresponding respectively to information bit lengths from 0 bit to M bits. However, as will be described later, only the error-correction encoders E(0), E(1) and E(M) differ in function from others. The switch 111 and the selector 112 select one error-correction encoder corresponding to the designated bit length from the M+1 error-correction encoders E(j) according to the designated bit length $k_i$ ($k_0, k_1, \ldots, k_{L-1}$) input from the information bit length switch 104. Each error-correction encoder E generates an encoded bit sequence by performing a matrix operation with the generator matrix. A typical example of the error-correction encoder E is shown in FIG. 4.

Figure 4:
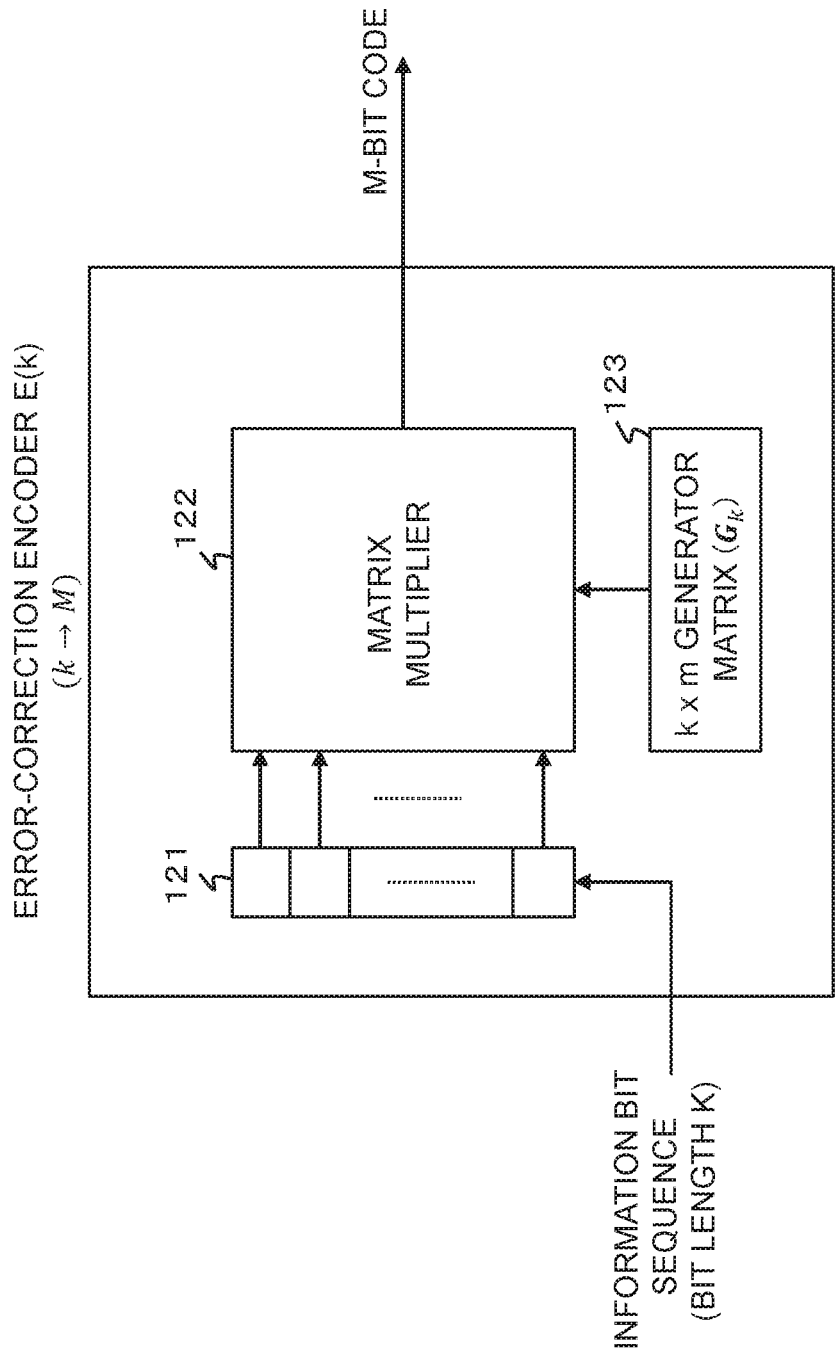
FIG. 4 is a block diagram showing a configuration example of an encoder in the variable information-length encoder shown in FIG. 3.

As illustrated in FIG. 4, each of the M+1 error-correction encoders E(j) has a register 121 that holds an input k-bit information bit sequence, a matrix multiplier 122, and a storage 123 that holds a previously designated k×m generator matrix $G_k$. The matrix multiplier 122 multiplies the bit sequence held in the register 121 by the k×M generator matrix $G_k$ to output a M-bit code which is the encoded k-bit input information.

1.3) Block Length Converter

Figure 5:
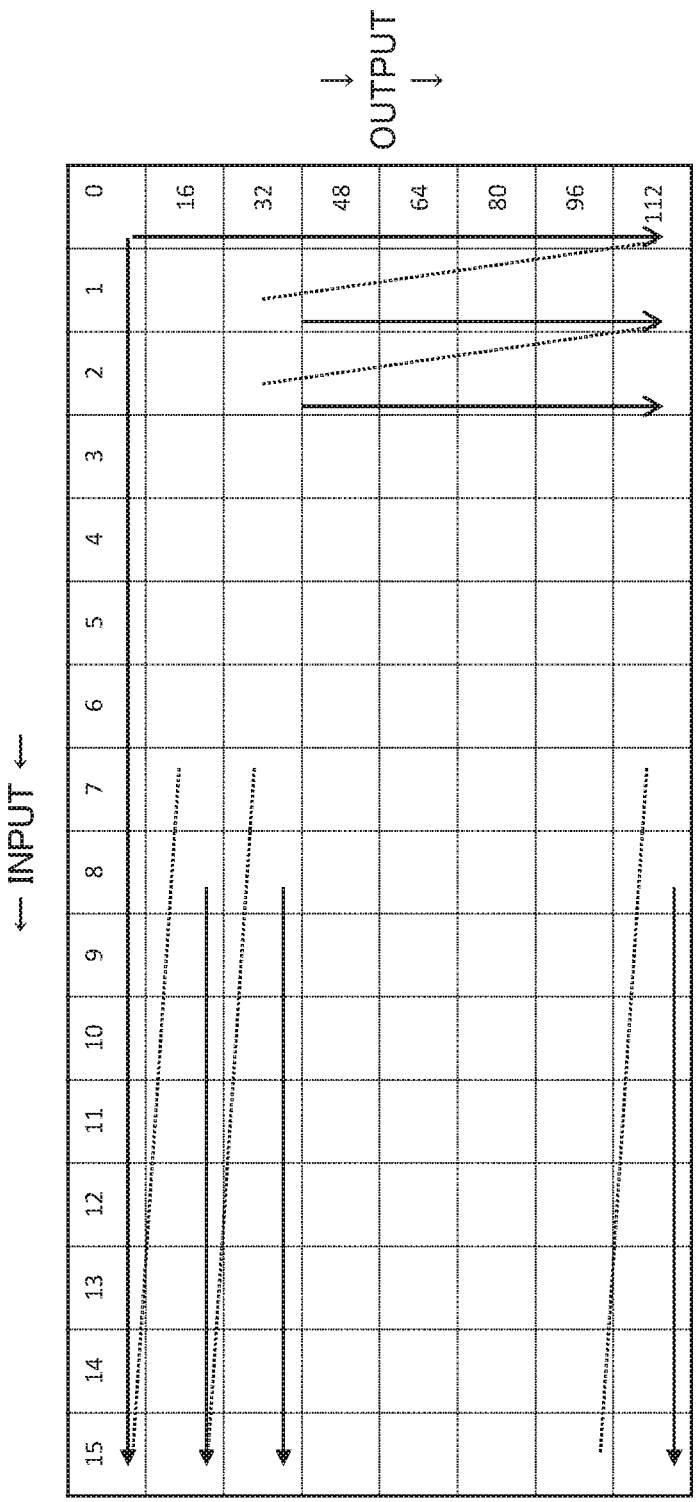
FIG. 5 is a bit array diagram showing an example of a conversion method of the block length converter in the encoding device shown in FIG. 2.

The block length converter 102 stores the encoded bit sequence input from the variable information-length encoder 101 in a predetermined array in a memory, and converts the block length M to the code length L of the Polar converter 103. As an example, as shown in FIG. 5, a method of converting an input block of a 16-bit length into an output block of an 8-bit length is described. That is, by arranging the 16-bit input blocks in the same bit order as shown in FIG. 5, an 8-bit output block becomes 8-bit data, each bit being located at the same bit position of each input block. In this way, the block length converter 102 can rearrange the input bit block into an output bit sequence of a desired bit length according to a certain rule.

1.4) Polar Converter

Figure 6:
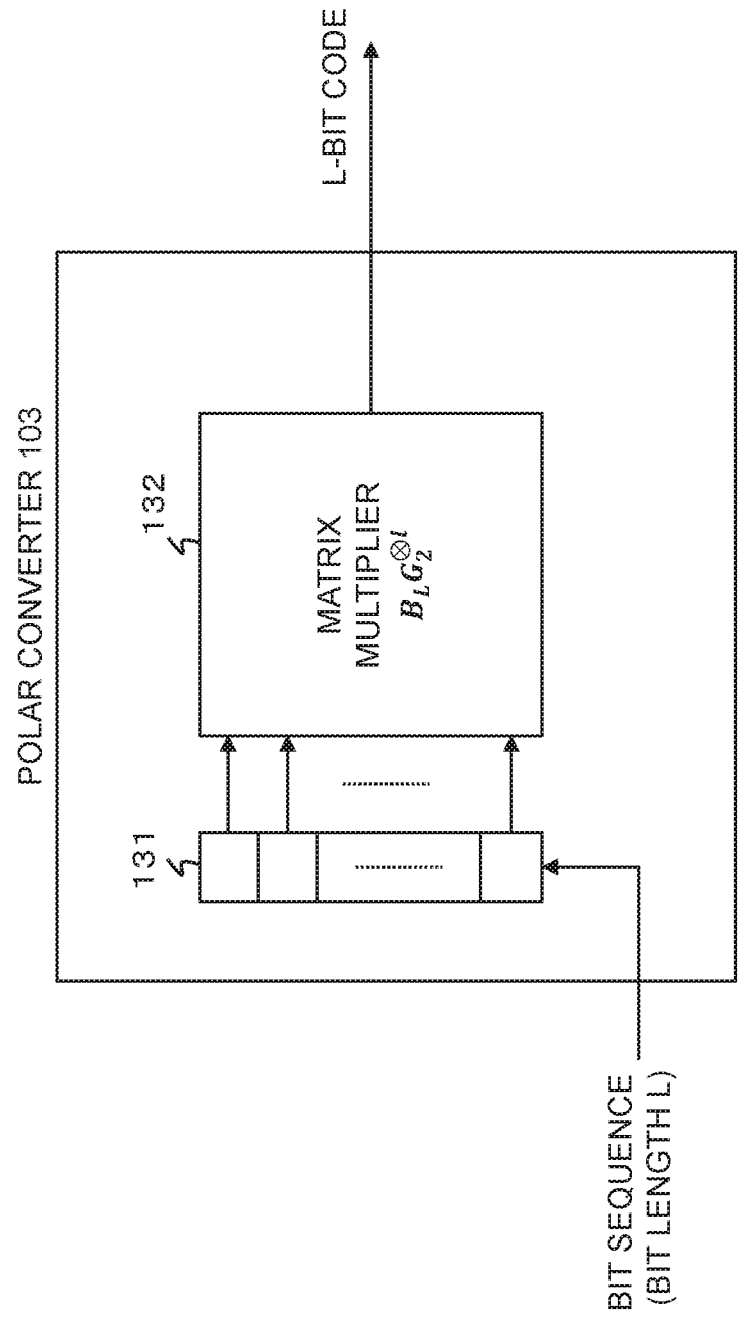
FIG. 6 is a block diagram showing a configuration example of a Polar converter in the encoding device shown in FIG. 2.

As illustrated in FIG. 6, the Polar converter 103 includes a register 131 that holds an L-bit input bit sequence and a matrix multiplier 132. Assuming that a bit-reversal matrix $B_L$ of size L is multiplied by an L×L matrix which is obtained by I-times Kronecker product of 2×2 matrix $G_2$ $$G_2 = \begin{pmatrix} 1 & 0 \\ 1 & 1 \end{pmatrix} \qquad \text{[Math. 1]}$$

to obtain a matrix product

[Math. 2]

$$B_L G_2^{\otimes l} \qquad (1),$$

the matrix multiplier 132 multiplies the bit sequence held in the register 131 by the above expression (1) to generate and output an L-bit code by Polar encoding (note that $L=2^l$).

1.5) Information Bit Length Switch

Figure 7:
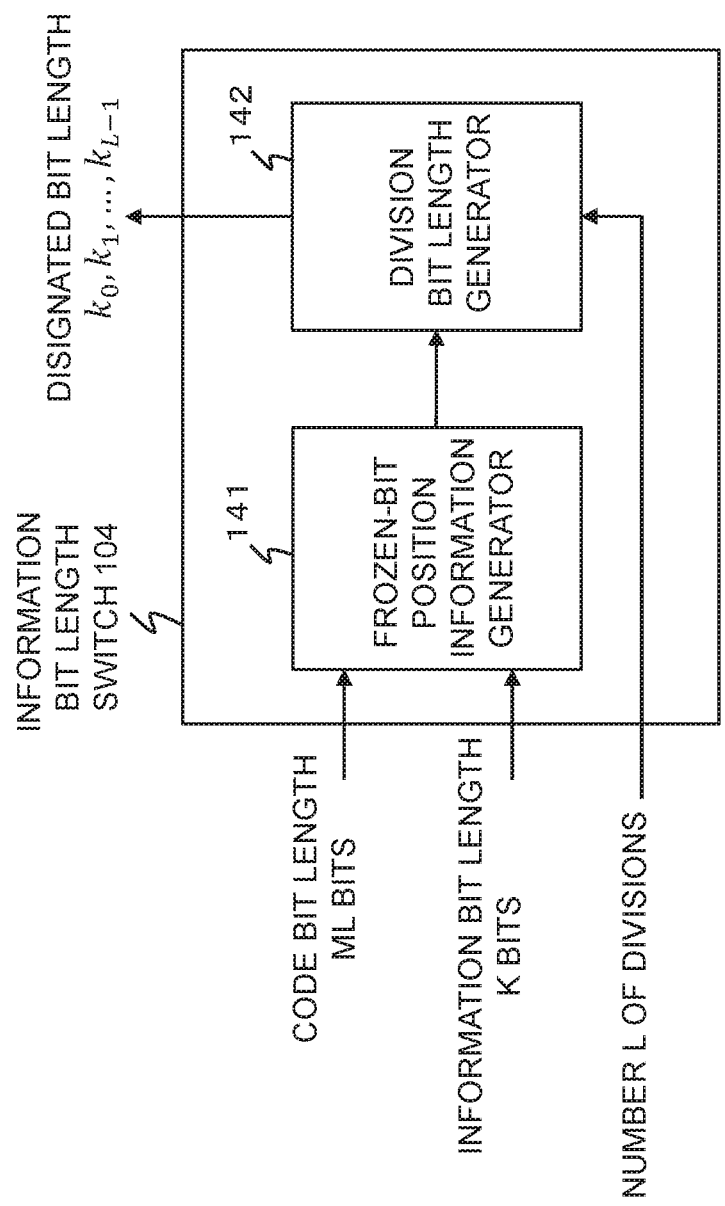
FIG. 7 is a block diagram showing a configuration example of an information-length switching designation section in the encoding device shown in FIG. 2.

As illustrated in FIG. 7, the information bit switch 104 has a frozen-bit position information generator 141 and a division bit length generator 142. The frozen-bit position information generator 141 receives the code bit length M×L and the information bit length K to calculate the frozen-bit position information of Polar encoding by which the information bit sequence of K-bit length is encoded as a code bit sequence of (M×L)-bit length. The division bit length generator 142 generates L designated bit lengths ($k_0, k_1, \ldots, k_{L-1}$) using the frozen bit position information and the number L of divisions. For example, the division bit length generator 142, for each of i=0, 1, . . . , L−1, counts the number of integers at positions other than frozen-bit positions in the set of integers {iM, iM+1, . . . , (i+1) M−1}, and sets the count value as a designated bit length $k_i$. In the Polar encoding scheme, by setting the designated bit length $k_i$ as described above, it is possible to allocate information bits to $k_i$ communication channels of high error tolerance with excluding communication channels of low tolerance as frozen bits.

1.6) Variable Information-Length Decoder

Figure 8:
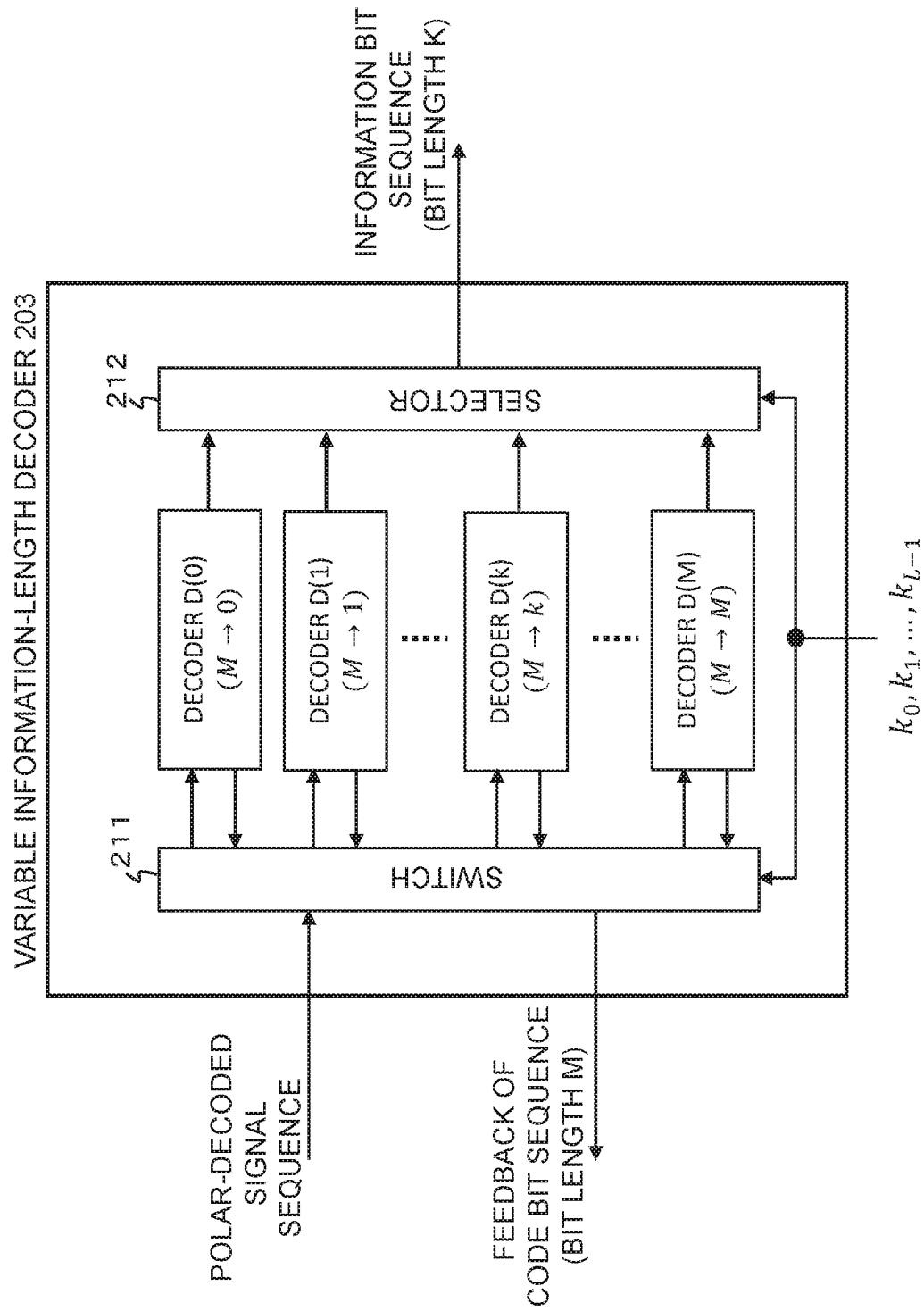
FIG. 8 is a block diagram showing a configuration example of a variable information-length decoder in the decoding device shown in FIG.

As illustrated in FIG. 8, the variable information-length decoder 203 includes M+1 error-correction decoders D (h) (h=0, 1, 2, ... , M) arranged in parallel between the switch 211 and the selector 212. The M+1 error-correction decoders D(h) differ from each other in the number of information bits corresponding to an input signal sequence, the error-correction decoders D(h) corresponding respectively to the error-correction encoders E(h) of the encoding apparatus 100. The switch 211 and the selector 212 select one error-correction decoder corresponding to the designated bit length from the M+1 error-correction decoders D(h) according to the designated bit length $k_i$ ($k_0$, $k_1$, ... , $k_{L-1}$) input from the information bit length switch 204. Each error-correction decoder D uses Viterbi decoding algorithm to generate a code bit sequence and an information bit sequence, and outputs the information bit sequence to the selector 212 and the code bit sequence to the switch 211. As described later, the code bit output from each error-correction decoder D is fed back to the M Polar decoders P-DEC(j) through the switch 211. A typical example of the error-correction decoder D is shown in FIG. 8.

Figure 9:
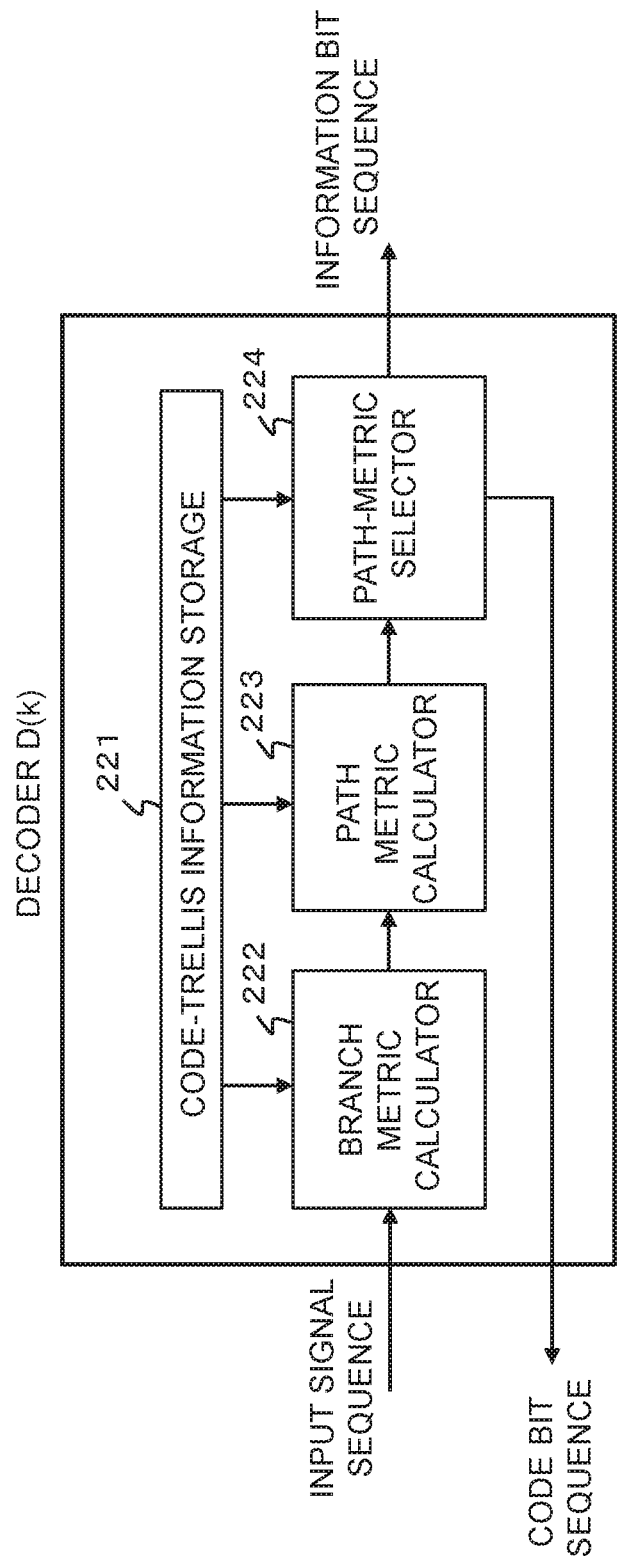
FIG. 9 is a block diagram showing a configuration example of a decoder in the variable information-length decoder shown in FIG. 2.

As illustrated in FIG. 9, each of the M+1 error-correction decoders D(h) includes a code trellis information storage 221, a branch metric calculator 222, a path metric calculator 223, and a path metric selector 224. The branch metric calculator 222, the path metric calculator 223 and the path metric selector 224 perform metric calculation and best metric selection with reference to the code trellis information stored in the code trellis information storage 221. The branch metric calculator 222 calculates the branch metric from the input signal sequence, the path metric calculator 223 calculates the path metric from the branch metric, and the path metric selector 224 selects the maximum likelihood path metric from the calculated path metrics and then calculates and outputs the code bit sequence and the information bit sequence corresponding to the maximum likelihood path metric. A specific example will be described later.

2. Operation 2.1) Encoding Operation

Figure 10:
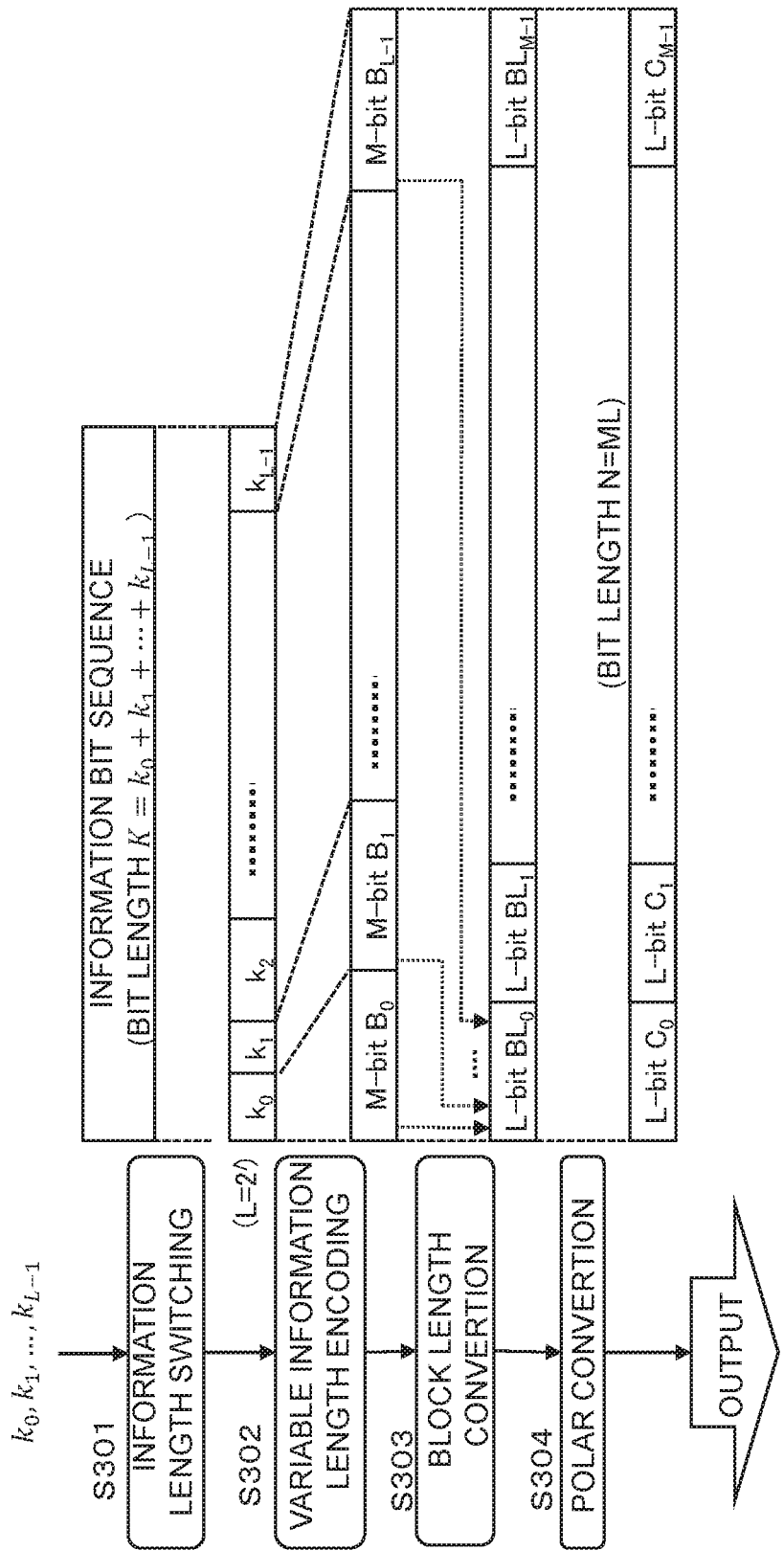
FIG. 10 is a diagram showing an example of a bit sequence for explaining the encoding method in the encoding device shown in FIG. 2.

As illustrated in FIG. 10, it is assumed that the encoding device 100 inputs an information bit sequence of K bit length and output a code bit sequence of M×L bit length. It is also assumed that the K-bit information bit sequence is divided into L blocks each having block lengths of 0 bits or more (including 0 bits) and M bits or less according to a designated bit length $k_0$, $k_1$, ... , $k_{L-1}$ corresponding to channel polarization. That is, $0 \leq k_i \leq M$ for i=0, 1, ... , L−1. The L designated bit lengths $k_0$, $k_1$, ... , $k_{L-1}$ are held in the information bit length switch 104 and supplied to the variable information-length encoder 101.

When the bit length $k_i$ is designated by the information bit length switching signal (operation S301), the variable information-length encoder 101 causes the switch 110 and the selector 111 to select the encoder E ($k_i$) corresponding to the designated bit length $k_i$. The selected encoder E ($k_i$) generates a code block Bi of M-bit length from the same number of information bits as the designated bit length $k_i$. The variable information-length encoder 101 performs the encoding operation L times from i=0 to L−1 (operation S302), and thereby outputs the L M-bit code blocks $B_0$ to $B_{L-1}$ to the block length converter 102.

However, the encoder E(0), which is selected when $k_i$=0, outputs a sequence 000 ... 0 consisting of M 0s as triggered by the information bit length switching signal. The encoder E(1), which is selected when $k_i$=1, outputs the input 1 bit of information M times repeatedly as triggered by the information bit length switching signal. The encoder E(M), which is selected when $k_i$=M, outputs the input M-bit information sequence as it is. In other cases ($k_i$=2, 3, ... M−1), the encoder E($k_i$) selected in each case multiplies the relevant $k_i$ bit information by the k×M generator matrix $G_k$, and outputs the result as an M-bit code block.

When the block length converter 102 inputs the L M-bit code blocks $B_0$ to $B_{L-1}$, converts them into M L-bit blocks $BL_0$ to $BL_{M-1}$ according to a predetermined rule, and output the results to the Polar converter 103. (Operation S303). For example, as illustrated in FIG. 5, L M-bit code blocks $B_0$ to $B_{L-1}$ are arranged in the same bit order, and L bits at the same bit positions of the L code blocks $B_0$ to $B_{L-1}$ are sequentially read out, thereby obtaining M L-bit blocks $BL_0$ to $BL_{M-1}$.

The Polar converter 103 sequentially inputs M L-bit blocks $BL_0$ to $BL_{M-1}$ and sequentially outputs M L-bit code data $C_0$ to $C_{M-1}$. Assuming that its input is an L-dimensional row vector u, the Polar converter 103 multiplies the row vector u by the L×L matrix shown in Expression (1) to obtain an L-dimensional row vector c:

$$c = u B_L G_2^{\otimes l}. \qquad \text{[Math. 3]}$$

In this way, the Polar converter 103 generates the above-mentioned L-dimensional row vector c for all of the M L-bit blocks $BL_0$ to $BL_{M-1}$, and outputs (M×L)-bit code data $C_0$ to $C_{M-1}$ as a code bit sequence of the encoding device 100.

2.2) Decoding Operation

The decoding device 200 inputs the signal sequence corresponding to the (M×L)-bit code bit sequence output by the encoding device 100 through the transmission channel or the memory medium. This input signal sequence is represented by a sequence of log-likelihood ratios corresponding to the code bits output by the encoding apparatus 100. Hereinafter, the logarithmic likelihood ratio at the input side corresponding to 1 bit at the output side is represented by m bits. Therefore, the number of bits of the input signal sequence of the decoding device 200 is m×M×L (hereinafter referred to as mML). For the sake of simplicity, the decoding operation using the SC decoding method will be described. The same can be applied to the case of the SC-List decoding method.

<Polar Decoding>

Figure 11:
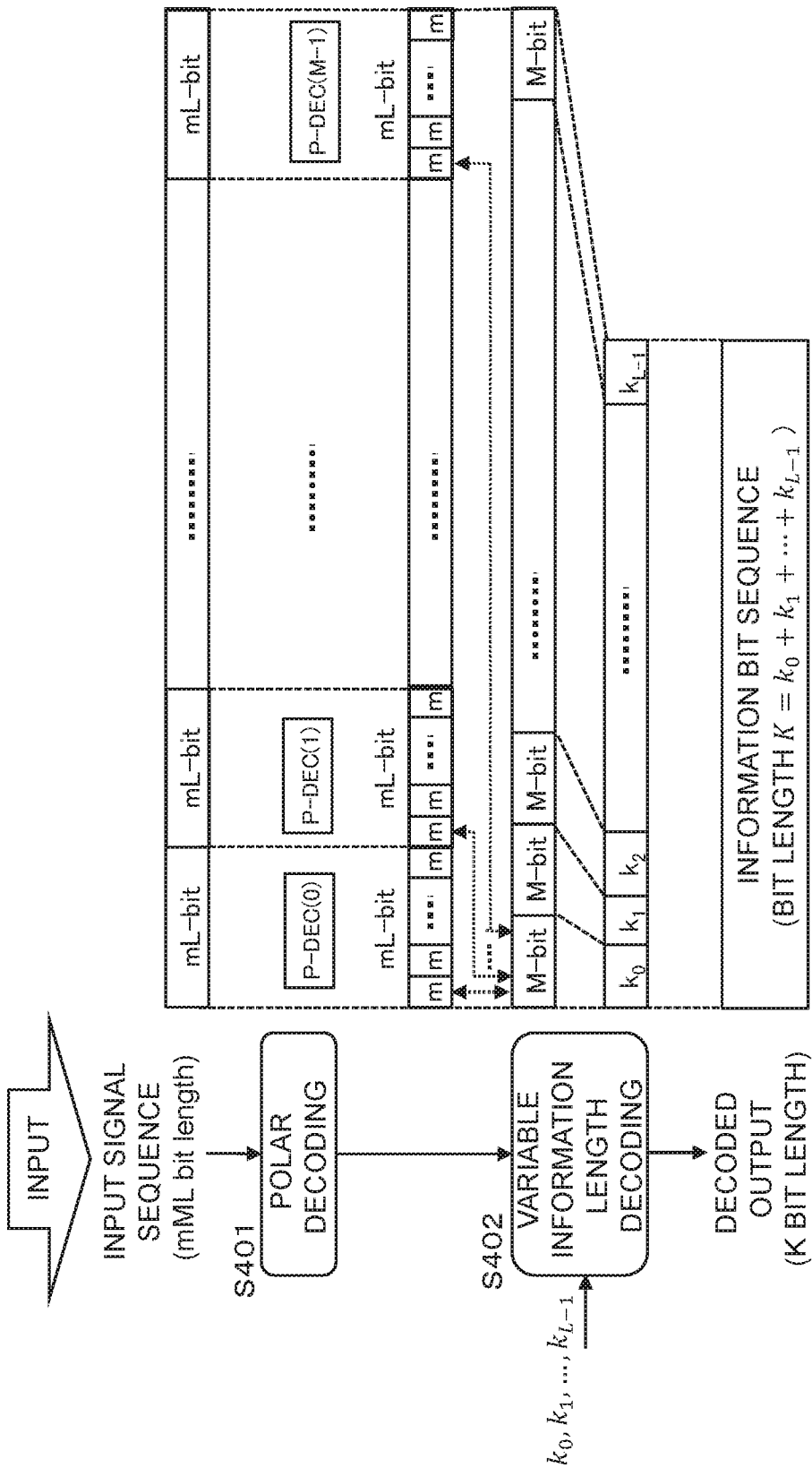
FIG. 11 is a diagram showing an example of a bit sequence for explaining the decoding method in the decoding device shown in FIG. 2.

As illustrated in FIG. 11, an input signal sequence of mML bit length is divided by the switch 201 for each of mL bits, which are input respectively to M polar decoders P-DEC(0) to P-DEC(M−1). The M mL-bit log-likelihood ratios correspond respectively to the L-bit codes $C_0$ to $C_{M-1}$ output by the Polar converter 103 of the encoding device 100. The M polar decoders P-DEC(0) to P-DEC(M−1) input M mL-bit input signals, respectively, and sequentially output corresponding mL-bit log-likelihood ratio values using the Polar code decoding method (operation S401). More specifically, each Polar decoder P-DEC sequentially outputs the mL-bit log-likelihood ratio data every m bits in L times. Hereinafter, each of the L m-bit data which is the output of the Polar decoder is distinguished in the output order i (=0, 1, ... , L−1). The information on the output order i is supplied from the information-length switch 204, as in the encoding device 100.

In the SC decoding method or SC-List decoding method described above, it is necessary to feed 1-bit data back to a corresponding Polar decoder every time m-bit log-likelihood ratio data is output. According to this embodiment, the feedback data is generated by the variable information-length decoder 203 in the subsequent stage.

The i-th m-bit data output from each of the M Polar decoders P-DEC(0) to P-DEC(M−1) is combined through the multiplexer/demultiplexer 202 and the mM bit data is output to the variable information-length decoder 203. The variable information-length decoder 203 generates a $k_i$-bit information bit sequence corresponding to the mM bit data and M-bit code data corresponding to this $k_i$-bit information bit sequence according to Viterbi decoding as described later (operation S402). For example, as will be described later, a part of the M-bit code data becomes a $k_i$-bit information bit sequence. The information bit sequence of $k_i$ bits becomes the output of the decoding device 200, the M-bit code data is demultiplexed through the multiplexer/demultiplexer 202, and each bit is fed back to the corresponding Polar decoder P-DEC.

More specifically, in the case of i<L−1, the multiplexer/demultiplexer 202 demultiplexes the M-bit code generated by the variable information-length decoder 203 in 1-bit units, and each bit is fed back to the corresponding Polar decoder P-DEC. The Polar decoder P-DEC calculates the (i+1)-th m-bit data using the fed back 1-bit data. Similarly, the above decoding process is repeated until i=L−1. Finally, the information bit sequence of a total of K (=$k_0+k_1+ \ldots +k_{L-1}$) bits is obtained.

<Variable Information-Length Decoding>

The operation of the variable information-length decoder 203 will be described. In principle, as shown in FIG. 8, the switch 211 and the selector 212 select one decoder from M+1 decoders D(0) to D(M) according to the information-length switching signal input from the information-length switch 204. The decoder D($k_i$) generates a $k_i$-bit information bit sequence and a corresponding M-bit code bit sequence, outputs the $k_i$-bit information through the selector 212, and feeds the M-bit code back to the Polar decoder side through the switch 211.

The M+1 decoders D(0) to D(M) correspond to the encoders E(0) to E(M) in the variable information-length encoder 101 of the encoding device 100, respectively. Therefore, the decoder D(0) which is selected when $k_i$=0 has no information bit from the selector 212, but feeds data "000 . . . 0" consisting of M 0s back to the switch 211.

The decoder D(1) selected when $k_i$=1 compares the sum of the decoded signals having a positive value and the sum of the decoded signals having a negative value with respect to the M Polar decoded signals represented by the m-bit log-likelihood ratio. In accordance with the comparison result, the decoder D(1) outputs 1-bit information of 0 or 1 through the selector 212 and also returns an M-bit sequence 000 . . . 0 or 111 . . . 1 as feedback data to the switch 211, wherein the M-bit sequence is obtained by repeating the generated 1 bit M times.

Further, the decoder D(M) selected when $k_i$=M determines whether each of the M Polar decoded signals is positive or negative and generates M-bit data. The decoder D(M) outputs it through the selector 212 and feeds it back to the Polar decoder side through the switch 211.

In other cases ($k_i$=2, 3, . . . M−1), the decoder D($k_i$) selected in each case uses the Viterbi decoding algorithm, as described in FIG. 9, to generate M bit code and $k_i$-bit information and to output the $k_i$ bit information to the selector 212 and the M-bit data as the feedback data to the switch 211.

According to the above-described decoding operation, the decoding device 200 terminates the process at the time when the information bit sequence of K bit length has been output from the input signal sequence of mML bit length.

2.3) Effects

According to the exemplary embodiment of the present invention as described above, M Polar decoding processes of bit length L can be performed in parallel. Further, as described in the next exemplary embodiment, the number of time steps required for the decoding process in the variable information-length decoder 203 using the Viterbi algorithm is M. Since the number of time steps required for the decoding process is M, the total number of time steps required for the decoding process is estimated as ML+L $\log_2 L$.

For example, assuming M=16 and L=64, decoding processing on a code bit sequence of a length of 1024 bits is performed. According to the present exemplary embodiment, since the information bit is divided by using the same channel polarization as that of the 1024-bit-length Polar code, the error-correction capability is equal to or higher than that of the conventional Polar encoding/decoding method and the decoding process can be completed in about 14% of the time steps.

3. Example

A specific operation of the above-described encoding device 100 and decoding device 200 will be described. As an example, it is assumed that the number of information bits K=64 bits, the code bit length ML=128, the number of divisions L=8, and the error-correction code length M=16. There will be described the case where a 64-bit information bit sequence is divided as $k_0$=0, $k_1$=2, $k_2$=4, $k_3$=11, $k_4$=5, $k_5$=12, $k_6$=14, $k_7$=16, that is, K=0+2+4+11+5+12+14+16 based on channel polarization similar to the conventional 128-bit-length Polar code. As will be described below, according to the present example, it is possible to obtain an error-correction capability equal to or higher than that of the conventional 128-bit-length Polar encoding/decoding method, and it is also possible to complete the decoding process in about 17% of the number of time steps, compared to the conventional 128-bit-length Polar encoding/decoding method.

3.1) Encoding

Referring to FIG. 10, information bits of K=64 bits are divided into eight blocks having different lengths (K=0+2+ 4+11+5+12+14+16). Each block is input to a corresponding encoder E in the variable information-length encoder 101, which outputs eight encoded bit blocks $B_0$ to $B_7$ of 16-bit length.

The variable information-length encoder 101 includes a total of 17 (=M+1) types of encoders E as shown in FIG. 3, but in this example, only eight types of k=0, 2, 4, 11, 5, 12, 14 and 16 are used. As described above, in the case of k=0, a 16-bit length of 000 . . . 0 is output. In the case of k=16, the input is output as it is. Accordingly, substantially six types of encoders E(2), E(4), E(5), E(11), E(12), E(14) are required. As shown in FIG. 4, the encoder E multiplies the k-bit input information bit by the k×16 generator matrix $G_k$. Therefore, in the present example, the following six generator matrices are used.

$$G_2 = \begin{pmatrix} 1 & 1 & 1 & 1 & 1 & 1 & 1 & 1 \\ & & & & 1 & 1 & 1 & 1 & 1 & 1 & 1 & 1 \end{pmatrix} \quad \text{[Math. 4]}$$

$$G_4 = \begin{pmatrix} 1 & 1 & & & 1 & 1 & & & 1 & 1 & 1 & 1 \\ & & 1 & 1 & & & 1 & 1 & & & 1 & 1 & & & 1 & 1 \\ & & & & 1 & 1 & 1 & 1 & & & & & 1 & 1 & 1 & 1 \\ & & & & & & & & 1 & 1 & 1 & 1 & 1 & 1 & 1 & 1 \end{pmatrix} \quad \text{[Math. 5]}$$

$$G_5 = \begin{pmatrix} 1 & & 1 & 1 & & & 1 & 1 & & 1 & & & & & 1 \\ 1 & & 1 & & 1 & & 1 & & 1 & & 1 & & & & 1 \\ & 1 & 1 & & & 1 & 1 & & 1 & 1 & & & 1 & 1 \\ & & & 1 & 1 & 1 & 1 & & & & 1 & 1 & 1 & 1 \\ & & & & & & & 1 & 1 & 1 & 1 & 1 & 1 & 1 & 1 \end{pmatrix} \quad \text{[Math. 6]}$$

$$G_{11} = \begin{pmatrix} 1 & & & 1 & & & 1 & 1 & 1 \\ & 1 & & & 1 & & 1 & 1 \\ & & 1 & & & 1 & & 1 & 1 \\ & & & 1 & & & 1 & & & 1 \\ & & & & 1 & & & 1 & 1 & 1 \\ & & & & & 1 & 1 & & & 1 & 1 \\ & & & & & & 1 & 1 & & & 1 & 1 \\ & & & & & & & 1 & 1 & 1 \\ & & & & & & & & 1 & 1 & 1 & 1 \\ & & & & & & & & & 1 & 1 & & 1 & 1 \\ & & & & & & & & & & & 1 & 1 & 1 & 1 \end{pmatrix} \quad \text{[Math. 7]}$$

$$G_{12} = \begin{pmatrix} 1 & & & 1 & & 1 & 1 \\ & 1 & & & 1 & 1 & 1 \\ & & 1 & & 1 & & 1 \\ & & & 1 & 1 & & & 1 \\ & & & & 1 & & 1 & 1 \\ & & & & & 1 & 1 & 1 \\ & & & 1 & 1 & & & 1 \\ & & & & & & 1 & 1 & 1 \\ & & & & & & & 1 & 1 & 1 \\ & & & & & & & & 1 & 1 \\ & & & & & & & & & 1 & 1 \\ & & & & & & & & & & 1 & 1 \end{pmatrix} \quad \text{[Math. 8]}$$

$$G_{14} = \begin{pmatrix} 1 & & 1 \\ 1 & & 1 \\ 1 & & 1 \\ 1 & & 1 \\ 1 & & 1 \\ 1 & & 1 \\ 1 & & 1 \\ & 1 & & 1 \\ & 1 & & 1 \\ & 1 & & 1 \\ & 1 & & 1 \\ & 1 & & 1 \\ & 1 & & 1 \\ & 1 & & 1 \end{pmatrix} \quad \text{[Math. 9]}$$

The eight 16-bit code blocks $B_0$ to $B_7$ as output of the variable information-length encoder 101 are converted in block length from 16 to 8 by the block length converter 102. Specifically, as shown in FIG. 5, the input bit sequence is written in the memory in a horizontal direction (16 bits for each row) and is read in the vertical direction (8 bits for each column). The 16 8-bit sequences whose bit order has been changed in this way are sequentially output to the Polar converter 103.

As illustrated in FIG. 6, the Polar converter 103 multiplies 8-bit input information by an 8×8 matrix shown below and outputs an 8-bit code. The Polar converter 103 sequentially outputs 16 8-bit codes and then terminates the encoding process.

$$B_8 G_2^{\otimes 3} = \begin{pmatrix} 1 & & & & & & & \\ 1 & & 1 & & & & & \\ 1 & 1 & & & & & & \\ 1 & 1 & 1 & 1 & & & & \\ 1 & 1 & & & & & & \\ 1 & 1 & & & 1 & 1 & & \\ 1 & 1 & 1 & 1 & & & & \\ 1 & 1 & 1 & 1 & 1 & 1 & 1 & 1 \end{pmatrix} \quad \text{[Math. 10]}$$

3.2) Decoding

The decoding device 200 inputs the signal sequence corresponding to ML (=128)-bit code sequence which is the output of the encoding device 100. In the case where each input signal is quantized in 9 (=m) bits including 1 bit representing positive or negative, the number of input bits to the decoding device 200 is 1152 (=128×9=ML×m) bits. By dividing this input signal sequence in units of 72 (=8×9=L× m) bits from the beginning into 16 divisions, the 16 division signal sequences are input to 16 Polar decoders P-DEC(0) to P-DEC(15), respectively.

The Polar decoder P-DEC uses the existing Polar decoding technique except for the generation of the feedback data required for each output data, and thus the description thereof will be omitted. Hereinafter, the variable information-length decoder 203 for generating feedback data and decoding output will be described.

As shown in FIG. 8, the variable information-length decoder 203 is provided with a total of 17 (=M+1) types of decoders D in principle, but in this example, only eight types of k=0, 2, 4, 11, 5, 12, 14, and 16 are used. As described above, since the cases of k=0 and k=16 do not matter, as in the case of the encoding apparatus 100, the six types of decoders D(2), D(4), D(5), D(11), D(12) and D(14) are substantially required. These six types of decoders D hold trellis codes corresponding respectively to the generator matrices $G_2, G_4, G_5, G_{11}, G_{12}$, and $G_{14}$ in the above six types of encoders E and outputs the information bit sequence and the code bit sequence by applying the Viterbi algorithm.

FIGS. 12 to 17 show six types of code-trellis corresponding to the generator matrices $G_2, G_4, G_5, G_{11}, G_{12}$, and $G_{14}$, respectively. However, the labels a, b, e, f, g, h labeled respectively on the branches in FIG. 15 indicate eight sets consisting of two 4-bit data as shown below.

$$a = \{0000, 1111\} \quad \text{[Math. 11]}$$
$$b = \{0011, 1100\}$$
$$c = \{0101, 1010\}$$
$$d = \{0110, 1001\}$$
$$e = \{0001, 1110\}$$
$$f = \{0010, 1101\}$$
$$g = \{0100, 1011\}$$
$$h = \{1000, 0111\}$$

Figure 16:
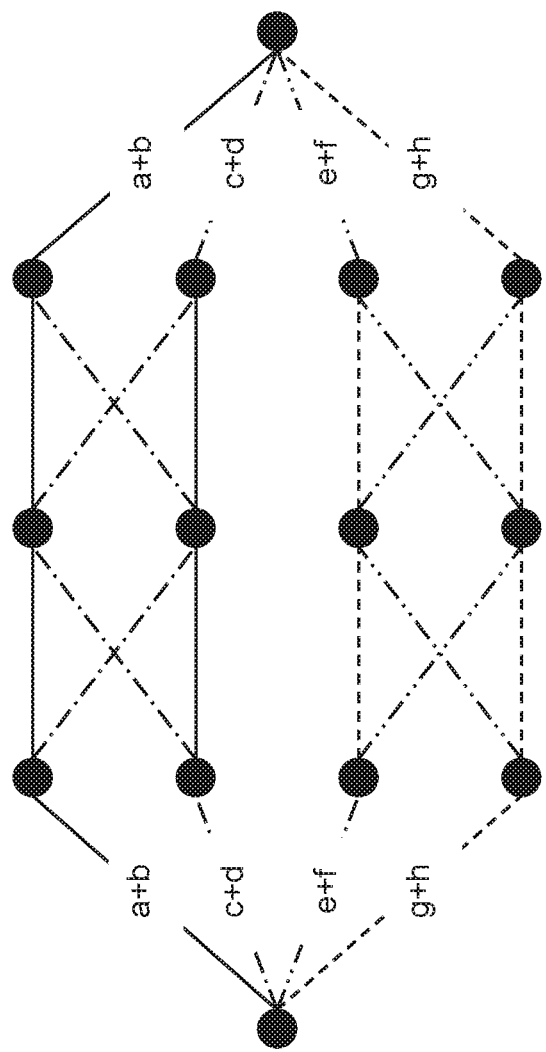
FIG. 16 is a diagram showing an example of a code-trellis having an information bit length of 12 and a code bit length of 16.

In addition, the labels shown on the branches in FIG. 16 represent the union of two sets selected from the above-described eight sets. For instance, $$a+b=\{0000,1111,0011,1100\}. \quad \text{[Math. 12]}$$

As with the above, other cases are processed.

Figure 17:
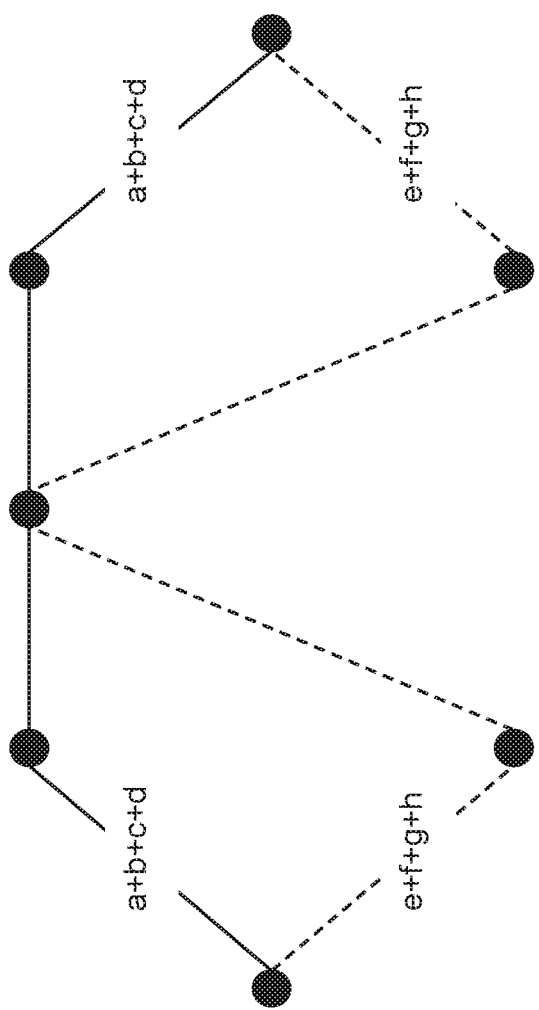
FIG. 17 is a diagram showing an example of a code-trellis having an information bit length of 14 and a code bit length of 16.

Furthermore, the labels shown on the branches in FIG. 17 represent the union of four sets selected from the above eight sets. For instance, $$a+b+c+d=\{0000,1111,0011,1100,0101,1010,0110,1001\}. \quad \text{[Math. 13]}$$

As with the above, other cases are processed.

Figure 12:
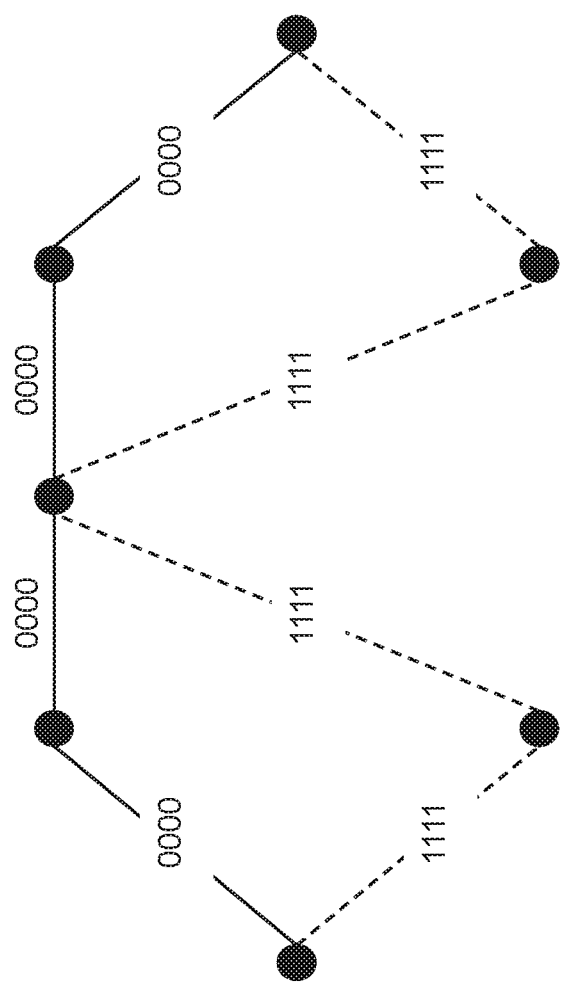
FIG. 12 is a diagram showing an example of a code-trellis having an information bit length of 2 and a code bit length of 16.
Figure 13:
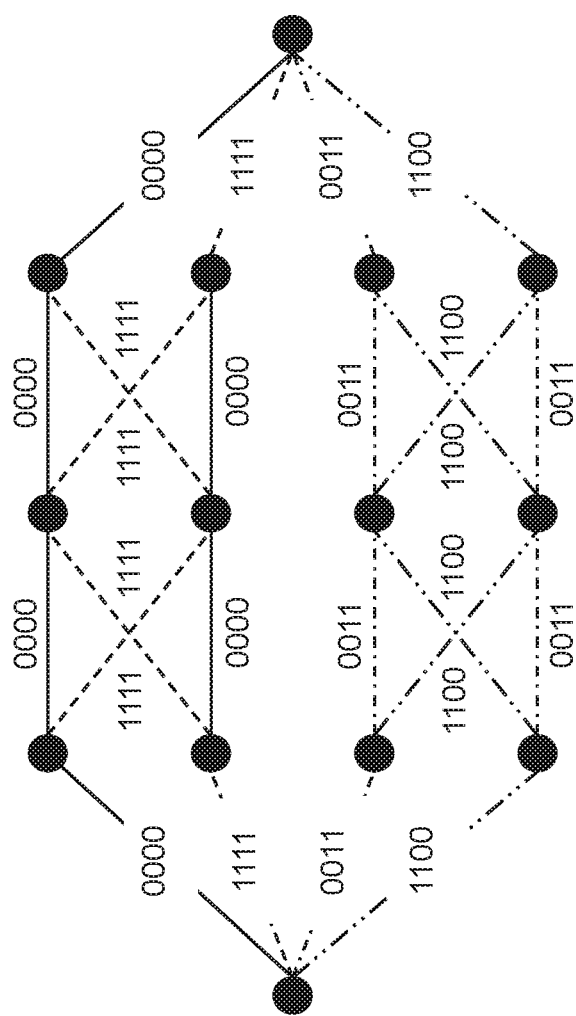
FIG. 13 is a diagram showing an example of a code-trellis having an information bit length of 4 and a code bit length of 16.
Figure 14:
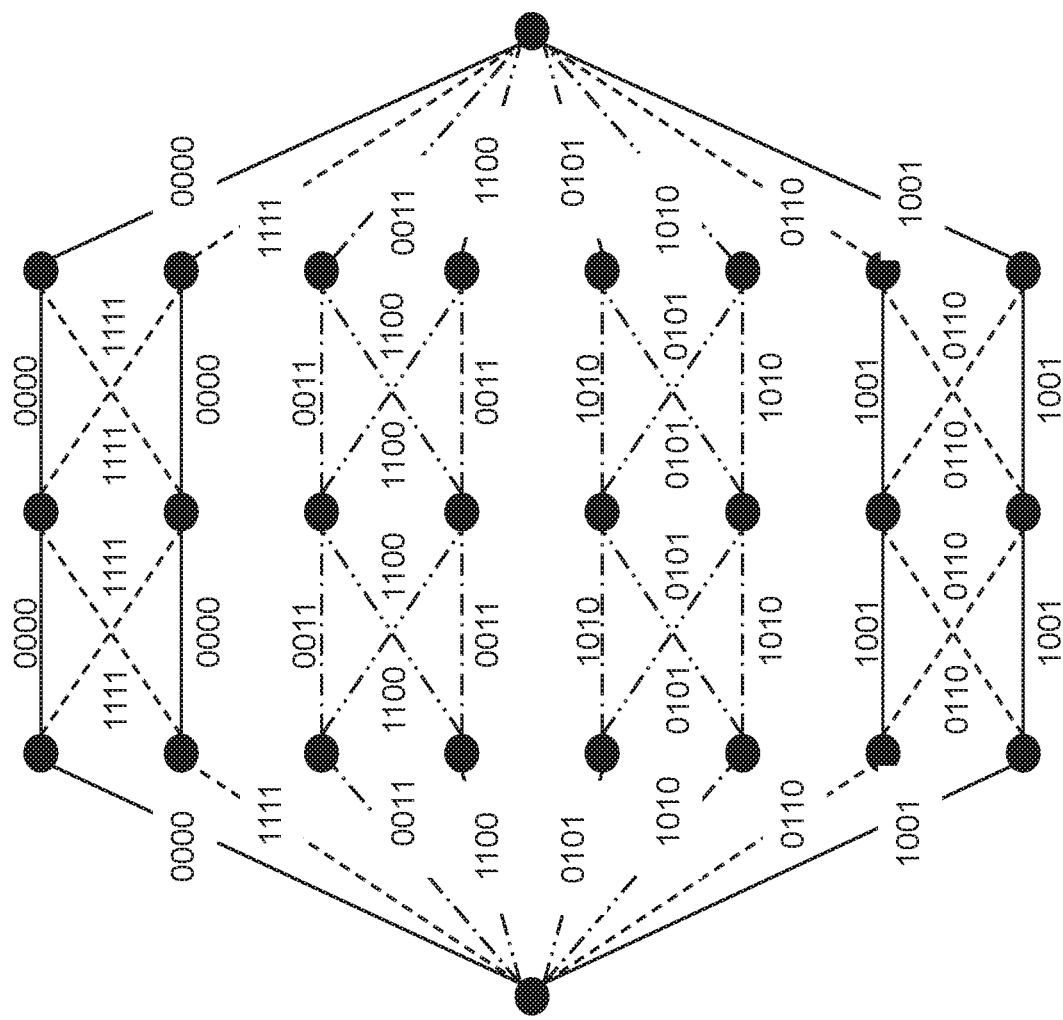
FIG. 14 is a diagram showing an example of a code-trellis having an information bit length of 5 and a code bit length of 16.
Figure 15:
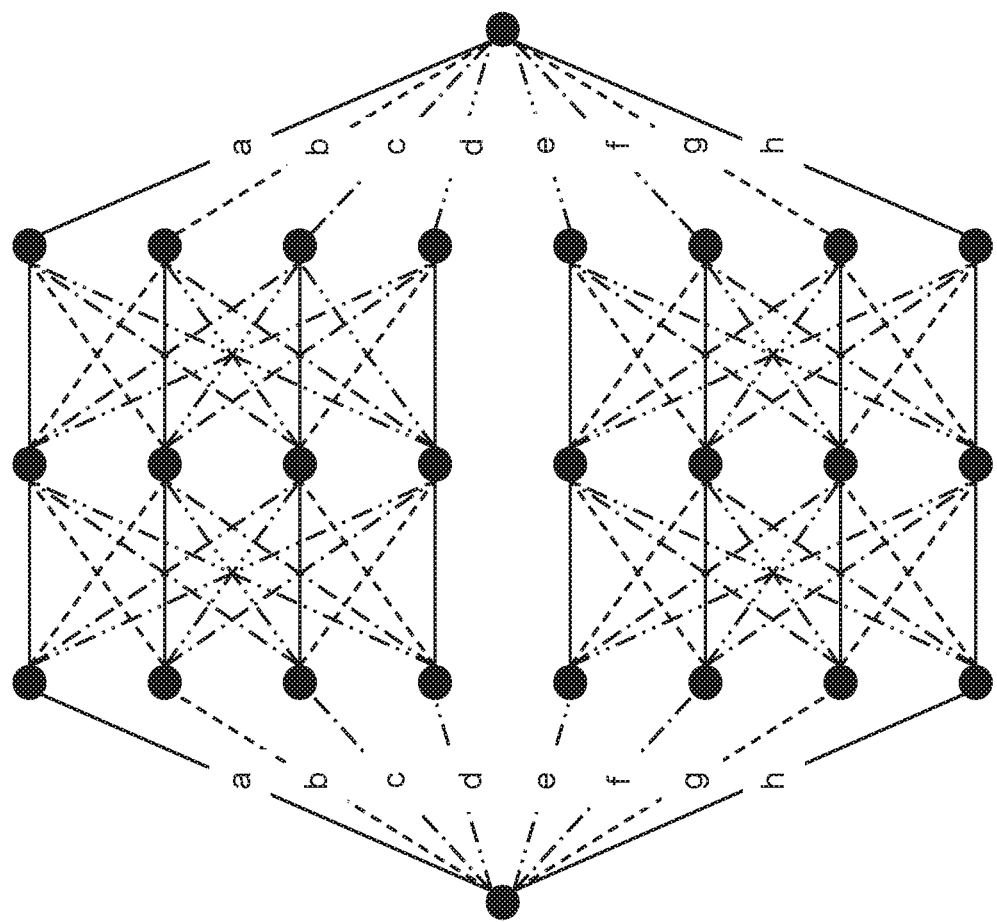
FIG. 15 is a diagram showing an example of a code-trellis having an information bit length of 11 and a code bit length of 16.

As described above, each of the branches in the trellis diagrams shown in FIGS. 12, 13 and 14 corresponds to one 4-bit label shown in the figures. The trellis shown in FIG. 15 corresponds to two 4-bit labels, the trellis shown in FIG. 16 to four 4-bit labels, and the trellis shown in FIG. 17 to eight 4-bit labels. In either case, the processing for 4 bits in unit-time step can be performed and accordingly the decoding process is completed in 4 unit-time steps at the shortest.

In each decoder D, the Viterbi algorithm based on each code-trellis is applied to the input signal sequence to calculate the maximum likelihood path. The maximum likelihood path can be calculated in 4 time units at the shortest as described above. The maximum likelihood path is composed of four branches and a corresponding information bit sequence of k bits is output. Further, a 16-bit sequence composed of the labels of four branches that are also the maximum likelihood path is fed as a code bit sequence back to the Polar decoder P-DEC.

The example of the decoding device 200 has been described above centering on the variable information-length decoder 203 and the decoder D that is a component thereof. Although the case where the Viterbi algorithm using code-trellis is used has been described as a configuration example of the decoder D, the use of the Viterbi algorithm is just one example and the present invention is not limited to this example. In particular, assuming that SC-List decoding is used in the Polar decoder P-DEC, a list Viterbi algorithm or another list decoding method matching the SC-List decoding can be used to guarantee at least the same level of error-correction capability as the conventional Polar code and decoding method.

4. Other Exemplary Embodiments

The above-described encoding device 100 and decoding device 200 may each be a single device, or both may be incorporated in a single data processing device. Further, the encoder/decoder may be configured on a single chip. Further, each function of the encoding device 100 and the decoding device 200 can also be implemented by executing a computer program on a processor. Such a program or a storage device storing the program is also included in the technical scope of the present invention.

Figure 18:
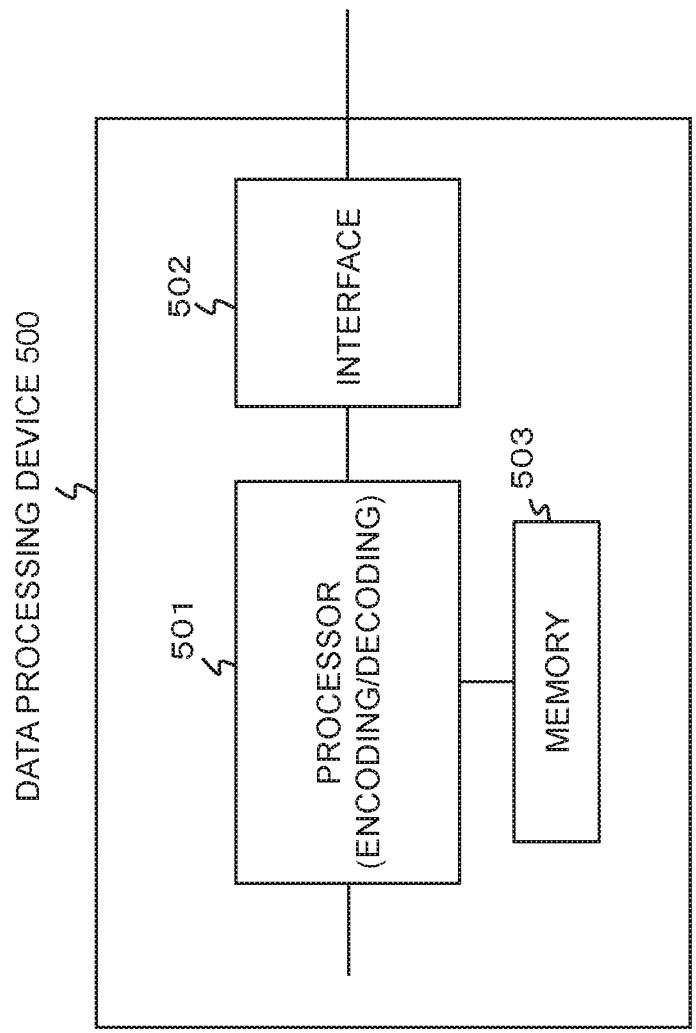
FIG. 18 is a block diagram showing a schematic configuration of a data processing device having the same function as the encoding device and/or the decoding device according to another embodiment of the present invention.

As illustrated in FIG. 18, it is assumed that the data processing device 500 includes a processor 501, an interface 502 for exchanging data with outside, and a memory 503 for storing programs and the like. The processor 501 functions as the encoding device 100 and/or the decoding device 200 by executing the programs that realizes the above-described encoding function and/or decoding function from the memory 503. Such a data processing device 500 can be used as the encoder and the decoder of a communication device or a data writing/reading device.

5. Supplementary Note

Part or all of the above-described exemplary embodiments may be described as, but not limited to, the following supplementary notes.

(Supplementary Note 1)

An encoding device that encodes an information bit sequence blocked into blocks of a constant bit length K to generate a code bit sequence of a constant bit length M×L, the encoding device comprising:

an error-correction encoding means that inputs the information bit sequence on division for each designated bit length according to an information-bit length switching signal and performs error-correction encoding on an information block of the designated bit length to generate L M-bit codes, each M-bit code having a predetermined bit length M;

a block length conversion means that converts the L M-bit codes into M L-bit blocks each having a predetermined bit length of L by reordering bits of the L M-bit codes;

a Polar conversion means that converts the M L-bit blocks to M L-bit codes, each L-bit code having a bit length of L, through channel polarization processing to output a converted M×L-bit code as the code bit sequence; and an information bit length switching means that generates the information bit length switching signal for dividing the information bit sequence into L designated bit lengths which are not necessarily constant, based on channel polarization information of the Polar conversion means.

(Supplementary Note 2)

The encoding device according to supplementary note 1, wherein the information bit length switching means sets the designated bit length as a count of integers at positions other than frozen-bit positions of the channel polarization in a set of integers $\{iM, iM+1, \ldots, (i+1)M-1\}$ for each i for I=0, 1, \ldots, L-1.

(Supplementary Note 3)

The encoding device according to supplementary note 1 or 2, wherein the error-correction encoding means comprises:

M+1 error-correction encoders each inputting different designated bit lengths k (k is an integer equal to or greater than 0 and equal to or smaller than M); and a selection means that selects one from the M+1 error-correction encoders according to the information bit length switching signal, wherein each of the M+1 error-correction encoders adds redundant bits to an information bit block of the designated bit length k to generate M-bit code, and the selection means selectively switches an error-correction encoder depending on the designated bit length k corresponding to the information bit length switching signal.

(Supplementary Note 4)

A decoding device that inputs an input signal sequence and estimates an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, the decoding device comprising:

M Polar decoding means that divides the input signal sequence into M input signal blocks, each input signal block including L input signals, performs the channel polarization processing on each of the M input signal blocks, and outputs L Polar decoded signals for each of the M input signal blocks;

an error-correction decoding means that inputs a Polar decoded signal according to a designated bit length designated by an information bit length switching signal, from M Polar decoded signal blocks, each Polar decoded signal block including L Polar decoded signals which are output respectively by the M Polar decoding means, and estimates the information bit sequence according to error-correction decoding scheme; and an information bit length switching means that generates the information bit length switching signal for designating, as the designated bit length, an information bit length included in the M Polar decoded signal blocks output respectively by the M Polar decoding means.

(Supplementary Note 5)

The decoding device according to supplementary note 4, wherein the information bit length switching means sets the designated bit length as a count of integers at positions other than frozen-bit positions in a Polar encoding scheme corresponding to the Polar decoding means, in a set of integers {iM, iM+1, . . . , (i+1) M−1} for each i for I=0, 1, . . . , L−1.

(Supplementary Note 6)

The decoding device according to supplementary note 4 or 5, wherein the error-correction decoding means comprises:

M+1 error-correction decoders each outputting different designated bit lengths k (k is an integer equal to or greater than 0 and equal to or smaller than M); and a selection means that selects one from the M+1 error-correction decoders according to the information bit length switching signal, wherein the M+1 error-correction decoders correspond respectively to M+1 error-correction encoders which generate M-bit codes by adding redundant bits to information bit blocks of designated bit lengths, and the selection means selectively switches an error-correction decoder depending on the designated bit length corresponding to the information bit length switching signal.

(Supplementary Note 7)

The decoding device according to supplementary note 6, wherein the M+1 error-correction decoders comprises:

a storage means that stores code-trellis information whose size is determined by a k×M generator matrix, wherein a designated bit length k is an integer equal to or greater than 0 and equal to or smaller than M; and a calculation means that estimates an information bit sequence of a bit length k according to Viterbi algorithm using the code-trellis information.

(Supplementary Note 8)

The decoding device according to one of supplementary notes 4-7, wherein the error-correction decoding means feeds code bits of a code bit sequence back to the M Polar decoding means for Polar decoding, respectively, the code bit sequence corresponding to the information bit sequence decoded in the M+1 error-correction decoders.

(Supplementary Note 9)

An encoding method for encoding an information bit sequence blocked into blocks of a constant bit length K to generate a code bit sequence of a constant bit length M×L, the encoding method comprising:

by an error-correction encoding means, inputting the information bit sequence on division for each designated bit length according to an information-bit length switching signal and performing error-correction encoding on an information block of the designated bit length to generate L M-bit codes, each M-bit code having a predetermined bit length M;

by a block length conversion means, converting the L M-bit codes into M L-bit blocks each having a predetermined bit length of L by reordering bits of the L M-bit codes;

by a Polar conversion means, converting the M L-bit blocks to M L-bit codes, each L-bit code having a bit length of L, through channel polarization processing to output a converted M×L-bit code as the code bit sequence; and by an information bit length switching means, generating the information bit length switching signal for dividing the information bit sequence into L designated bit lengths which are not necessarily constant, based on channel polarization information of the Polar conversion means.

(Supplementary Note 10)

The encoding method according to supplementary note 8, wherein the information bit length switching means sets the designated bit length as a count of integers at positions other than frozen-bit positions of the channel polarization in a set of integers {iM, iM+1, . . . , (i+1) M−1} for each i for I=0, 1, . . . , L−1.

(Supplementary Note 11)

The encoding method according to supplementary note 8 or 9, wherein the error-correction encoding means selects one from M+1 error-correction encoders according to the information bit length switching signal, the M+1 error-correction encoders each inputting different designated bit lengths k (k is an integer equal to or greater than 0 and equal to or smaller than M); and each of the M+1 error-correction encoders adds redundant bits to an information bit block of the designated bit length k to generate M-bit code, and selectively switches an error-correction encoder depending on the designated bit length k corresponding to the information bit length switching signal.

(Supplementary Note 12)

A decoding method for inputting an input signal sequence and estimating an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, the decoding method comprising:

by M Polar decoding means, dividing the input signal sequence into M input signal blocks, each input signal block including L input signals, performing the channel polarization processing on each of the M input signal blocks, and outputting L Polar decoded signals for each of the M input signal blocks;

by an error-correction decoding means, inputting a Polar decoded signal according to a designated bit length designated by an information bit length switching signal, from M Polar decoded signal blocks, each Polar decoded signal block including L Polar decoded signals which are output respectively by the M Polar decoding means, and estimating the information bit sequence according to error-correction decoding scheme; and by an information bit length switching means, generating the information bit length switching signal for designating, as the designated bit length, an information bit length included in the M Polar decoded signal blocks output respectively by the M Polar decoding means.

(Supplementary Note 13)

The decoding method according to supplementary note 12, wherein the information bit length switching means sets the designated bit length as a count of integers at positions other than frozen-bit positions in a Polar encoding scheme corresponding to the Polar decoding means, in a set of integers {iM, iM+1, . . . , (i+1) M−1} for each i for I=0, 1, . . . , L−1.

(Supplementary Note 14)

The decoding method according to supplementary note 12 or 13, wherein the error-correction decoding means selects one from M+1 error-correction decoders according to the information bit length switching signal, the M+1 error-correction decoders each outputting different designated bit lengths k (k is an integer equal to or greater than 0 and equal to or smaller than M);

the M+1 error-correction decoders correspond respectively to M+1 error-correction encoders which generate M-bit codes by adding redundant bits to information bit blocks of designated bit lengths; and the selection means selectively switches an error-correction decoder depending on the designated bit length corresponding to the information bit length switching signal.

(Supplementary Note 15)

The decoding method according to supplementary note 14, wherein the M+1 error-correction decoders:

stores code-trellis information whose size is determined by a k×M generator matrix, wherein a designated bit length k is an integer equal to or greater than 0 and equal to or smaller than M; and estimates an information bit sequence of a bit length k according to Viterbi algorithm using the code-trellis information.

(Supplementary Note 16)

The decoding method according to one of supplementary notes 12-15, wherein the error-correction decoding means feeds code bits of a code bit sequence back to the M Polar decoding means for Polar decoding, respectively, the code bit sequence corresponding to the information bit sequence decoded in the M+1 error-correction decoders.

(Supplementary Note 17)

A program that causes a computer to function as an encoding device that encodes an information bit sequence blocked into blocks of a constant bit length K to generate a code bit sequence of a constant bit length M×L, the program comprising:

an error-correction encoding function of inputting the information bit sequence on division for each designated bit length according to an information-bit length switching signal and performs error-correction encoding on an information block of the designated bit length to generate L M-bit codes, each M-bit code having a predetermined bit length M;

a block length conversion function of converting the L M-bit codes into M L-bit blocks each having a predetermined bit length of L by reordering bits of the L M-bit codes;

a Polar conversion function of converting the M L-bit blocks to M L-bit codes, each L-bit code having a bit length of L, through channel polarization processing to output a converted M×L-bit code as the code bit sequence; and an information bit length switching function of generating the information bit length switching signal for dividing the information bit sequence into L designated bit lengths which are not necessarily constant, based on channel polarization information of the Polar conversion means.

(Supplementary Note 18)

A program that causes a computer to function as an decoding device that inputs an input signal sequence and estimates an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, the program comprising:

M Polar decoding functions of dividing the input signal sequence into M input signal blocks, each input signal block including L input signals, of performing the channel polarization processing on each of the M input signal blocks, and of outputting L Polar decoded signals for each of the M input signal blocks;

an error-correction decoding function of inputting a Polar decoded signal according to a designated bit length designated by an information bit length switching signal, from M Polar decoded signal blocks, each Polar decoded signal block including L Polar decoded signals which are output respectively by the M Polar decoding means, and estimating the information bit sequence according to error-correction decoding scheme; and an information bit length switching function of generating the information bit length switching signal for designating, as the designated bit length, an information bit length included in the M Polar decoded signal blocks output respectively by the M Polar decoding means.

(Supplementary Note 19)

A data processing device comprising: an encoding device according to one of supplementary notes 1-3; and a decoding device according to one of supplementary notes 4-8.

(Supplementary Note 20)

A communication apparatus comprising the data processing device according to supplementary note 19.

(Supplementary Note 21)

A data writing/reading apparatus comprising the data processing device according to supplementary note 19.

INDUSTRIAL APPLICABILITY

The present invention is applicable to an encoding device and a decoding device in a system in which bit errors may occur in digital data due to disturbance such as noises.

100 Encoder
101 Variable information-length encoder
102 Block length converter
103 Polar converter
104 Division bit length switch
111 Switch
112 Selector
121 Register
122 Matrix multiplier
123 k×M generator matrix
131 Register
132 Matrix multiplier
141 Frozen-bit position information generator
142 Division bit length generator
200 Decoding device
201 Switch
202 Multiplexer/demultiplexer
203 Variable information-length decoder
204 Information bit length switch
211 Switch
212 Selector
221 Code-trellis information storage
222 Branch metric calculator
223 Path metric calculator
224 Path metric selector
500 Data processing device
501 Processor
502 Interface
503 Memory

The invention claimed is:

1. An encoding device that encodes an information bit sequence of a constant bit length K, to generate a code bit sequence of a constant bit length M×L, the encoding device comprising:
   a variable information-length encoder configured to:
      input the information bit sequence;
      divide the information bit sequence into L information blocks of designated bit lengths according to an information-bit length switching signal; and
      perform error-correction encoding on each of the L information blocks to generate L M-bit codes;
   a block length converter that converts the L M-bit codes into M L-bit blocks by reordering bits of the L M-bit codes;
   a Polar converter that converts the M L-bit blocks to M L-bit codes through channel polarization processing to output a converted M×L-bit code as the code bit sequence; and
   an information bit length switch that generates the information bit length switching signal for dividing the information bit sequence into L designated bit lengths which are not necessarily constant, based on channel polarization information of the Polar converter.

2. The encoding device according to claim 1, wherein the information bit length switch sets the designated bit lengths as a count of integers at positions other than frozen-bit positions of the channel polarization in a set of integers {iM, iM+1, . . . , (i+1) M−1} for each i for I=0, 1, . . . , L−1.

3. The encoding device according to claim 1, wherein the variable information-length encoder comprises:
   M+1 error-correction encoders each inputting different designated bit lengths k (k is an integer equal to or greater than 0 and equal to or smaller than M); and
   a selector that selects one from the M+1 error-correction encoders according to the information bit length switching signal,
   wherein each of the M+1 error-correction encoders adds redundant bits to an information bit block of a corresponding designated bit length k to generate an M-bit code, and the selector selectively switches an error-correction encoder depending on the designated bit length k corresponding to the information bit length switching signal.

4. A decoding device that inputs an input signal sequence and decodes an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, the decoding device comprising:
   M Polar decoding means that decoders configured to:
      divide the input signal sequence into M input signal blocks, each input signal block including L input signals;
      performs the channel polarization processing on each of the M input signal blocks; and
      outputs L Polar decoded signals for each of the M input signal blocks;
   a variable information-length decoder configured to:
      input a Polar decoded signal according to a designated bit length designated by an information bit length switching signal, from M Polar decoded signal blocks, each Polar decoded signal block including L Polar decoded signals which are output respectively by the M Polar decoding means decoders; and
      estimate the information bit sequence according to error-correction decoding scheme; and
   an information bit length switch that generates the information bit length switching signal for designating, as the designated bit lengths, information bit lengths included in the M Polar decoded signal blocks output respectively by the M Polar decoders.

5. The decoding device according to claim 4, wherein the information bit length switch sets the designated bit length as a count of integers at positions other than frozen-bit positions in a Polar encoding scheme corresponding to the Polar decoders, in a set of integers {iM, iM+1, . . . , (i+1) M−1} for each i for I=0, 1, . . . , L−1.

6. The decoding device according to claim 4, wherein the variable information-length decoder comprises:
   M+1 error-correction decoders each outputting different designated bit lengths k (k is an integer equal to or greater than 0 and equal to or smaller than M); and
   a selector that selects one from the M+1 error-correction decoders according to the information bit length switching signal,
   wherein the M+1 error-correction decoders correspond respectively to M+1 error-correction encoders which generate M-bit codes by adding redundant bits to information bit blocks of designated bit lengths, and the selector selectively switches an error-correction decoder depending on the designated bit length corresponding to the information bit length switching signal.

7. The decoding device according to claim 6, wherein the M+1 error-correction decoders comprises:
   a storage that stores code-trellis information whose size is determined by a k×M generator matrix, wherein a designated bit length k is an integer equal to or greater than 0 and equal to or smaller than M; and
   a calculator configured to estimates an information bit sequence of a bit length k according to Viterbi algorithm using the code-trellis information.

8. The decoding device according to claim 4, wherein the error-correction decoders feeds code bits of a code bit sequence back to the M Polar decoding means for Polar decoding, respectively, the code bit sequence corresponding to the information bit sequence decoded in the M+1 error-correction decoders.

9. An encoding method for encoding an information bit sequence of a constant bit length K, to generate a code bit sequence of a constant bit length M×L, the encoding method comprising:
   by a variable information-length encoder,
      inputting the information bit sequence;
      dividing the information bit sequence into L information blocks of designated bit lengths according to an information-bit length switching signals; and
      performing error-correction encoding on each of the L information blocks to generate L M-bit codes;
   by a block length converter, converting the L M-bit codes into M L-bit blocks by reordering bits of the L M-bit codes;
   by a Polar converter, converting the M L-bit blocks to M L-bit codes through channel polarization processing to output a converted M×L-bit code as the code bit sequence; and
   by an information bit length switch, generating the information bit length switching signal for dividing the information bit sequence into L designated bit lengths which are not necessarily constant, based on channel polarization information of the Polar converter.

10. The encoding method according to claim 9, wherein the information bit length switch sets the designated bit length as a count of integers at positions other than frozen-bit positions of the channel polarization in a set of integers $\{iM, iM+1, \ldots, (i+1)M-1\}$ for each i for I=0, 1, ..., L−1.

11. The encoding method according to claim 9, wherein the variable information-length encoder selects one from M+1 error-correction encoders according to the information bit length switching signal, the M+1 error-correction encoders each inputting different designated bit lengths k (k is an integer equal to or greater than 0 and equal to or smaller than M); and each of the M+1 error-correction encoders adds redundant bits to an information bit block of a corresponding designated bit length k to generate M-bit code, and selectively switches an error-correction encoder depending on the designated bit length k corresponding to the information bit length switching signal.

12. A decoding method for inputting an input signal sequence and decoding an information bit sequence from the input signal sequence, the input signal sequence corresponding to a code bit sequence of a constant bit length M×L, wherein an encoding device generates the code bit sequence through error-correction encoding and channel polarization processing on an information bit sequence of a constant bit length K, the decoding method comprising:

by M Polar decoders, dividing the input signal sequence into M input signal blocks, each input signal block including L input signals, performing the channel polarization processing on each of the M input signal blocks, and outputting L Polar decoded signals for each of the M input signal blocks;

by a variable information-length decoder, inputting a Polar decoded signal according to a designated bit length designated by an information bit length switching signal, from M Polar decoded signal blocks, each Polar decoded signal block including L Polar decoded signals which are output respectively by the M Polar decoders, and estimating the information bit sequence according to error-correction decoding scheme; and by an information bit length switch, generating the information bit length switching signal for designating, as the designated bit length, an information bit length included in the M Polar decoded signal blocks output respectively by the M Polar decoders.

13. The decoding method according to claim 12, wherein the information bit length switch sets the designated bit length as a count of integers at positions other than frozen-bit positions in a Polar encoding scheme corresponding to the Polar decoding means, in a set of integers $\{iM+1, \ldots, (i+1)M-1\}$ for each i for I=0, 1, ..., L−1.

14. The decoding method according to claim 12, wherein the variable information-length decoder selects one from M+1 error-correction decoders according to the information bit length switching signal, the M+1 error-correction decoders each outputting different designated bit lengths k (k is an integer equal to or greater than 0 and equal to or smaller than M);

the M+1 error-correction decoders correspond respectively to M+1 error-correction encoders which generate M-bit codes by adding redundant bits to information bit blocks of designated bit lengths; and an error-correction decoder is selectively switched depending on the designated bit length corresponding to the information bit length switching signal.

15. The decoding method according to claim 14, wherein at each of the M+1 error-correction decoders, storing code-trellis information whose size is determined by a k×M generator matrix, wherein a designated bit length k is an integer equal to or greater than 0 and equal to or smaller than M; and estimating an information bit sequence of a bit length k according to Viterbi algorithm using the code-trellis information.

16. The decoding method according to claim 12, wherein the variable information-length decoder feeds code bits of a code bit sequence back to the M Polar decoding means for Polar decoding, respectively, the code bit sequence corresponding to the information bit sequence decoded in the M+1 error-correction decoders.

* * * * *